(12) United States Patent
Shimada et al.

(10) Patent No.: US 8,259,101 B2
(45) Date of Patent: Sep. 4, 2012

(54) SKETCH-BASED DESIGN SYSTEM, APPARATUS, AND METHOD FOR THE CONSTRUCTION AND MODIFICATION OF THREE-DIMENSIONAL GEOMETRY

(75) Inventors: Kenji Shimada, Pittsburgh, PA (US); Levent Burak Kara, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 780 days.

(21) Appl. No.: 12/308,118

(22) PCT Filed: Jun. 7, 2007

(86) PCT No.: PCT/US2007/013429
§ 371 (c)(1),
(2), (4) Date: Apr. 15, 2009

(87) PCT Pub. No.: WO2007/146069
PCT Pub. Date: Dec. 21, 2007

(65) Prior Publication Data
US 2009/0284550 A1    Nov. 19, 2009

Related U.S. Application Data

(60) Provisional application No. 60/811,597, filed on Jun. 7, 2006.

(51) Int. Cl.
*G06T 15/00* (2011.01)
(52) U.S. Cl. ........ 345/419; 345/420; 345/441; 345/552; 382/276; 348/E13.058
(58) Field of Classification Search .................. 345/419, 345/420, 441, 552, 420.441; 382/276; 348/E13.058
See application file for complete search history.

(56) References Cited

U.S. PATENT DOCUMENTS

| | | | |
|---|---|---|---|
| 5,583,977 A | 12/1996 | Seidl | |
| 6,549,201 B1 * | 4/2003 | Igarashi et al. | 345/423 |
| 6,628,279 B1 | 9/2003 | Schell et al. | |
| 7,248,270 B1 * | 7/2007 | Boylan | 345/679 |
| 7,568,171 B2 * | 7/2009 | Boylan | 715/863 |
| 7,580,816 B2 * | 8/2009 | Thompson et al. | 703/2 |
| 7,586,490 B2 * | 9/2009 | McDaniel | 345/441 |
| 7,864,173 B2 * | 1/2011 | Handley et al. | 345/420 |
| 2003/0025713 A1 | 2/2003 | Wang et al. | |
| 2006/0082571 A1 | 4/2006 | McDaniel | |

OTHER PUBLICATIONS

Yang "Ketch-based Modeling of Parameterized Objects", Thesis 2003.*
Masry et al. "A Freehand Sketching Interface for Progressive Construction and analysis of 3D Objects". 2004.*
Naya et al. "Sketch-Based Interfaces for Parametric Modelling". 2006.*

(Continued)

*Primary Examiner* — Kimbinh T Nguyen
(74) *Attorney, Agent, or Firm* — Downs Rachlin Martin PLLC

(57) ABSTRACT

Methods, apparatuses, and systems for sketch-based design, construction, and modification of three-dimensional geometry, including a computer drawing system, comprising a two dimensional input device, a display device, and a processor connected to the input device and the display device. The processor includes memory containing computer readable instructions which, when executed, cause the processor to define a three dimensional shape model, receive from the two dimensional input device an input indicative of a two dimensional hand drawn element, map the two dimensional hand drawn element to a corresponding portion of the three dimensional shape model, and modify the corresponding portion of the three dimensional shape model to resemble the two dimensional hand drawn element.

26 Claims, 28 Drawing Sheets

OTHER PUBLICATIONS

Form PCT/ISA/220, PCT Noticfication of Transmittal of the International Search Report and the Written Opinion of the International Searching Authority, or the Declaration for International Application No. PCT/US2007/013429.

Form PCT/ISA/210, PCT International Search Report for International Application No. PCT/US2007/013429.

Form PCT/ISA/237, PCT Written Opinion of the International Searching Authority for International Application No. PCT/US2007/013429.

PCT "Notification Concerning Transmittal of International Preliminary Report on Patentability" for International Application No. PCT/US2007/013429, mailed Dec. 24, 2008.

PCT "International Preliminary Report on Patentability" for International Application No. PCT/US2007/013429, mailed Dec. 24, 2008.

PCT "Written Opinion of the International Searching Authority" for PCT Application No. PCT/US2007/013429, mailed Dec. 24, 2008.

* cited by examiner

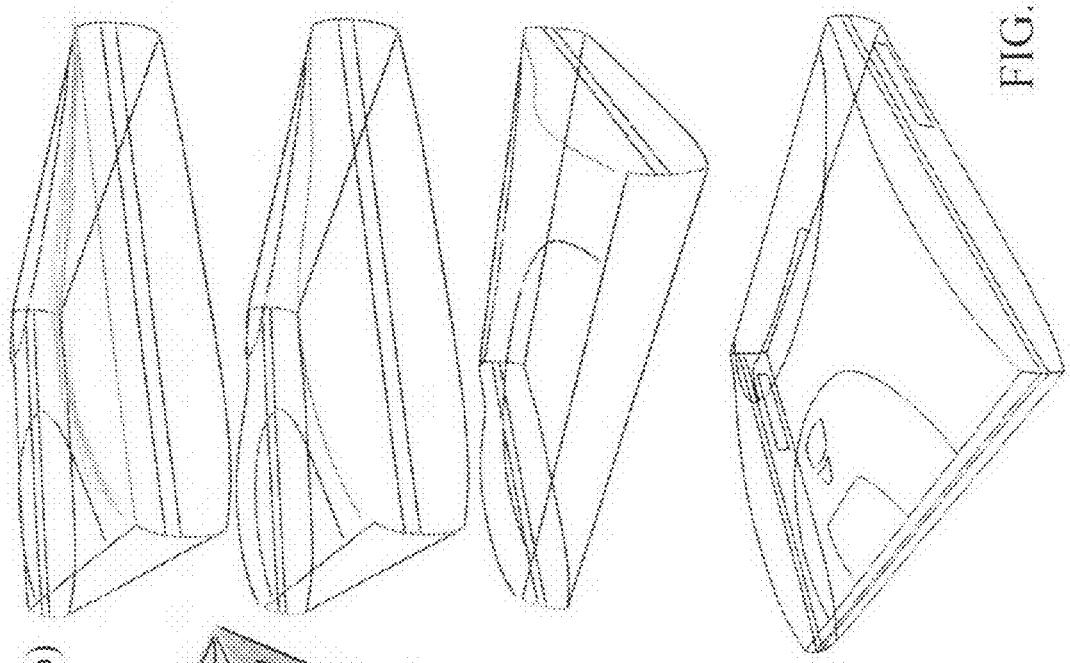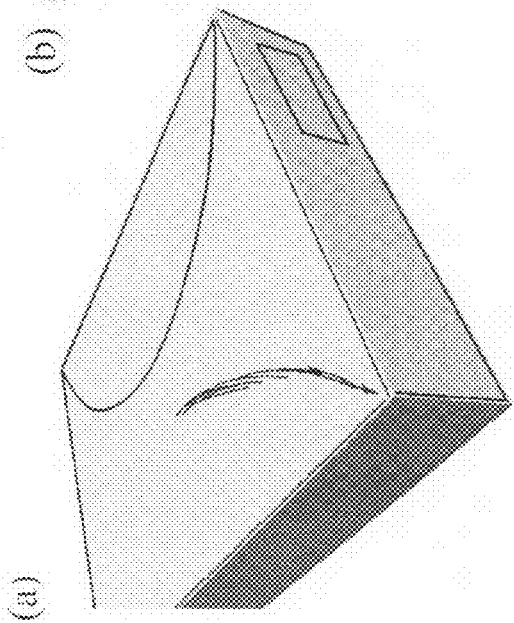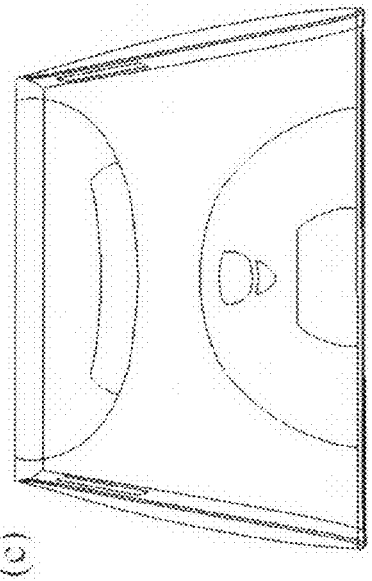
FIG. 27

SKETCH-BASED DESIGN SYSTEM, APPARATUS, AND METHOD FOR THE CONSTRUCTION AND MODIFICATION OF THREE-DIMENSIONAL GEOMETRY

CROSS-REFERENCE TO RELATED APPLICATIONS

This application claims priority from International application number PCT/US2007/013429, filed Jun. 7, 2007, which claims priority from U.S. Provisional Patent Application No. 60/811,597, filed Jun. 7, 2006, both of which are incorporated herein by reference.

STATEMENT REGARDING FEDERALLY-SPONSORED RESEARCH AND DEVELOPMENT

Not Applicable.

FIELD OF THE INVENTION

The present invention is directed generally to methods, apparatuses, and systems for sketch-based design, construction, and modification of three-dimensional geometry.

BACKGROUND OF THE INVENTION

Electronic three-dimensional models are a valuable tool in manufacturing and engineering industries, and are used in the design, engineering, and production of consumer products, industrial equipment, and many other items. However, the design, construction, and modification of electronic three-dimensional models is a tedious and time consuming process.

Prior art tools used in the design, construction, and modification of electronic three-dimensional models do not allow for intuitive input from the user. For example, designers are usually accustomed to creating drawings in a two dimensional format with pens and pencils on paper. This creative process involves the designer drawing lines, curves, and other shapes in a free hand format. The design can evolve and change by the designer drawing and redrawing portions of the drawing. As a result, the designer will frequently use multiple pen strokes to create a particular line or surface.

However, prior art devices used for the design, construction, and modification of electronic three-dimensional models use a very different process. For example, such prior art systems typically require changes to be made by identifying a point on a line, moving that point, and allowing the line to be redrawn by the software. This process requires a great deal of time and experience in order to produce smooth or complex lines and shapes. As a result, skilled users, and not the designers, are often employed to operate such machines. These skilled users and designers must work together to create and modify the three-dimensional designs over many iterations until an acceptable result is achieved. This process is time consuming and expensive.

Accordingly, there is a need for improved methods, apparatuses, and systems for sketch-based design, construction, and modification of three-dimensional geometry, particularly for methods, apparatuses, and systems which can offer a more efficient and intuitive interface. Those and other advantages of the present invention will be described in more detail hereinbelow.

BRIEF SUMMARY OF THE INVENTION

Methods, apparatuses, and systems for sketch-based design, construction, and modification of three-dimensional geometry. In one embodiment, the present invention includes a computer drawing system, comprising a two dimensional input device, a display device, and a processor connected to the input device and the display device. The processor includes memory containing computer readable instructions which, when executed, cause the processor to define a three dimensional shape model, receive from the two dimensional input device an input indicative of a two dimensional hand drawn element, map the two dimensional hand drawn element to a corresponding portion of the three dimensional shape model, and modify the corresponding portion of the three dimensional shape model to resemble the two dimensional hand drawn element.

In another embodiment of the present invention, the computer readable instructions cause the processor to display a two dimensional image on the display prior to receiving the input from the two dimensional input device, and align the two dimensional image with the three dimensional shape model.

In another embodiment of the present invention, the input indicative of a two dimensional hand drawn element includes a plurality of two dimensional hand drawn elements collectively forming the two dimensional hand drawn element. In addition the processor defines each of the plurality of two dimensional hand drawn elements with a plurality of data points, the processor identifies a direction of maximum spread of the data points defining the plurality of two dimensional hand drawn elements, the processor defines a straight line approximation of the data points, the processor projects the data points onto the straight line approximation of the data points, the processor sorts the data points based on their position on the straight line approximation, and the processor forms a single two dimensional element based on the sorted data points.

In another embodiment of the present invention, after the processor forms a single two dimensional element, the processor transforms the single two dimensional element into a three dimensional element.

In another embodiment of the present invention, the processor modifies a portion of the three dimensional shape model by projecting the corresponding portion of the three dimensional shape model onto a two dimensional plane corresponding to a two dimensional hand drawn element, changing the portion of the three dimensional shape model that is projected onto the two dimensional plane to resemble the two dimensional hand drawn element, producing a modified two dimensional portion of the three dimensional shape model, and projecting the modified two dimensional portion of the three dimensional shape model back into the three dimensional shape model, producing a modified portion of the three dimensional shape model.

In another embodiment of the present invention, the three dimensional shape model is comprised of a plurality of elements, each element is connected to at least one other element; and the corresponding portion of the three dimensional shape model is less than all of an element.

In another embodiment of the present invention, the input indicative of a two dimensional hand drawn element includes a hand drawn reference element indicative of the current shape of a corresponding portion of the three dimensional shape model, and a hand drawn element indicative of a desired modified shape of the corresponding portion of the three dimensional shape model. In addition, the processor maps the hand drawn element indicative of a desired modified shape to the corresponding portion of the three dimensional, and the processor modifies the corresponding portion of the three dimensional shape model to resemble the desired modified shape.

The present invention allows for a more efficient and intuitive interface for the design, construction, and modification of electronic three-dimensional models, as well as other applications. Many other modifications and variations are possible with the present invention. These and other teachings, variations, and advantages of the present invention will become apparent from the following detailed description of the invention.

BRIEF DESCRIPTION OF THE SEVERAL VIEWS OF THE DRAWING

Embodiments of the present invention will now be described, by way of example only, with reference to the accompanying drawings for the purpose of illustrating the embodiments, and not for purposes of limiting the invention, wherein:

FIG. 27 illustrates curve creation and modification according to one embodiment of the present invention.

DETAILED DESCRIPTION OF THE INVENTION

Figure 1A:
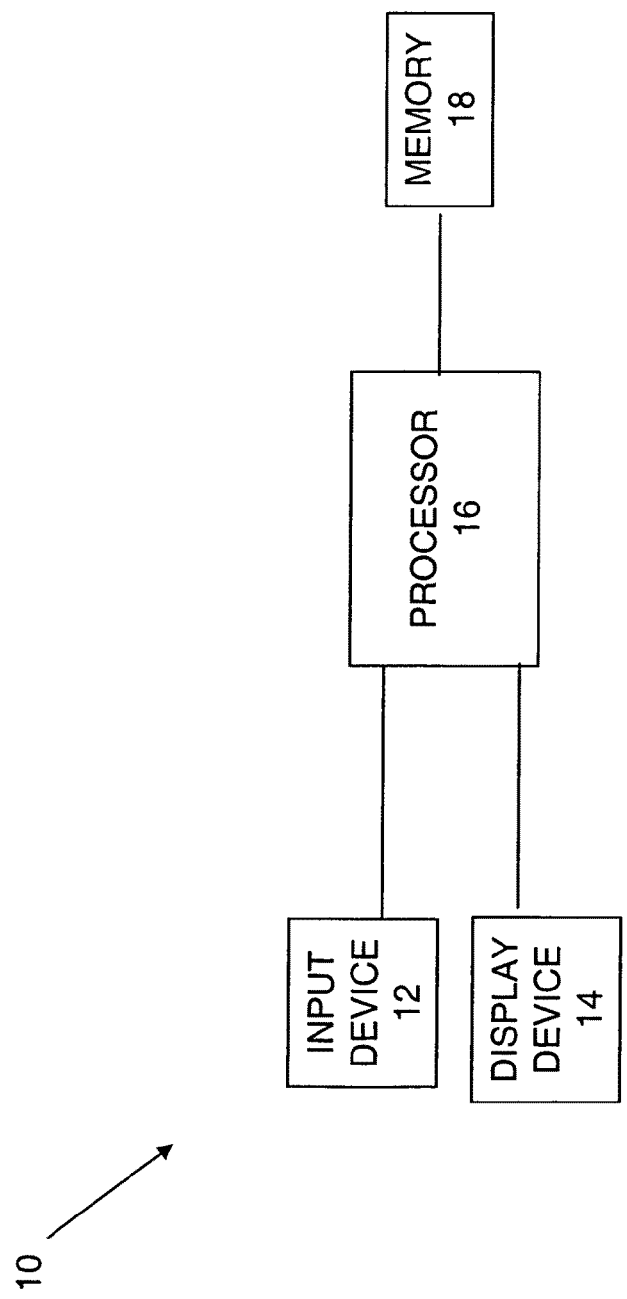
FIG. 1a illustrates one embodiment of a system according to the present invention.

1. A General Framework for 3D Modeling with Sketch Input

The present invention describes a pen-based modeling system for the styling design of 3D objects. The present invention allows users to create and edit 3D geometry through direct sketching on a two-dimensional input device, such as a pen-enabled tablet computer. One distinguishing feature of the present invention is that it is tailored toward the rapid and intuitive design of styling features such as free-form curves and surfaces, which is often a tedious, if not complicated, task using conventional software.

The present invention will be described in terms such as "3D geometry". "template", "wireframe model", "surface template", and others. These terms all describe "three dimensional shape models" which are used with the present invention. For example, the terms "wireframe geometry" and "surface geometry" are generally used to describe different types of three dimensional shape models. The term "template" is generally used to describe a three dimensional shape model used as the starting point for the present invention. After being modified, the resulting three dimensional shape model is no longer a "template", but rather a finished three dimensional shape model. Those and other terms will be used to describe the present invention.

The present invention teaches a new framework which allows for rapid construction and modification of 3D geometry through a sketch-based interface. The modeling framework will be described in terms of template generation, wireframe construction, wireframe modification, surface construction, surface modification, and detailing. Each of these concepts will be described in more detail hereinbelow.

"Template generation" is the process by which a template is created. Users begin the design process with a working 'template'. The template may be constructed by the user, selected from a library of templates, or pre-selected for the user. This initial template can be a wireframe model with only edge data, or it can have surface information resulting in volumetric data. The purpose of the template is to provide a platform on which users' subsequent design strokes can be reliably interpreted in 3D. Depending on the user's choice, wireframe template models can be obtained by automatically extracting the feature edges from existing CAD models, or by having the user directly sketch the wireframe models.

By automatically extracting the feature edges from existing CAD models, feature edges extracted from CAD models are used as wireframe models. Feature edges are extracted by detecting sharp transitions (based on curvature) in the surface data of the CAD models.

In other embodiments, the user directly sketches the wireframe models. For example, the user sketches a set of key feature edges requested by the program. Using the sketched edges, the program automatically creates a 3D wireframe model.

Likewise, volumetric template models can be obtained by intersecting the infinite volumes obtained by silhouette extrusion of three orthogonal views (top, front, side), or by shrink-wrapping a closed surface such as a sphere around the wireframe model.

By intersecting the infinite volumes obtained by silhouette extrusion of three orthogonal views (top, front, side), the user draws the three approximate silhouettes of the design object, from which the program automatically creates a volumetric template.

By shrink-wrapping a closed surface such as a sphere around the wireframe model, a previously obtained wireframe model is shrink-wrapped with a sphere until the sphere takes the shape suggested by the wireframe.

"Wireframe construction" is the process by which a wireframe is created. For example, users may create a 3D wireframe by sketching constituent edges on a 3D template model.

"Wireframe modification" is the process by which a wireframe is modified. Users can modify the initial wireframe by aligning the 3D wireframe with a scanned or digitally created 2D sketch of the object and tracing the curves on the sketch, or by directly sketching new edge shapes on the wireframe from arbitrary vantage points. In some embodiments, such as when the user is tracing curves on the sketch, the display device does not show the shape model, but rather shows the 2D sketch or some other image. In other embodiments, the display device shows the shape model that the user is modifying. In other embodiments, the display device may show the shape model as well as other images.

"Surface construction" is the process by which surfaces are created. For example, users can construct interpolating surfaces on the wireframe model.

"Surface modification" is the process by which surfaces are modified. For example, initially created surfaces can be deformed and beautified to obtain the desired form.

"Detailing" is the process by which additional edge creation and surfacing can be repeated indefinitely until the final shape and associated details are achieved.

The main input device used with the present invention is a two dimensional input device, such as a digital sketchpad or tablet. The invention will generally be described in the context of a pressure sensitive LCD digitizing tablet with a cordless stylus, although other forms of two dimensional input devices may also be used, such as a traditional computer mouse, and other forms of two dimensional input devices. Users' strokes are collected as time sequenced (x;y) coordinates sampled along the stylus' trajectory. In one embodiment the stylus contains two buttons along its barrel, similar to the left and right buttons on a mouse, which can be, for example, customized for the camera rotation and translation operations, or for other operations. The user interface may also consist of a main drawing region, and a side toolbar for accessing commonly used commands and settings. Other variations of the user interface are also possible.

FIG. 1a illustrates one embodiment of a system 10 according to the present invention. In that embodiment, the system 10 includes a two dimensional input device 12, an output or display device 14, such as a monitor, a processor 16, and memory 18. The processor 16 is connected to the input device 12, the output or display device 14, and the memory 18. The memory 18 includes computer readable instructions which, when executed by the processor 16, cause the processor 16 to perform certain functions, as described herein.

Many variations are possible with the system 10 according to the present invention. For example, more than one processor 16, input device 12, output device 14, and memory 18 may be present in the system 10. In addition, devices not shown in FIG. 1a may also be included in the system 10.

Figure 1B:
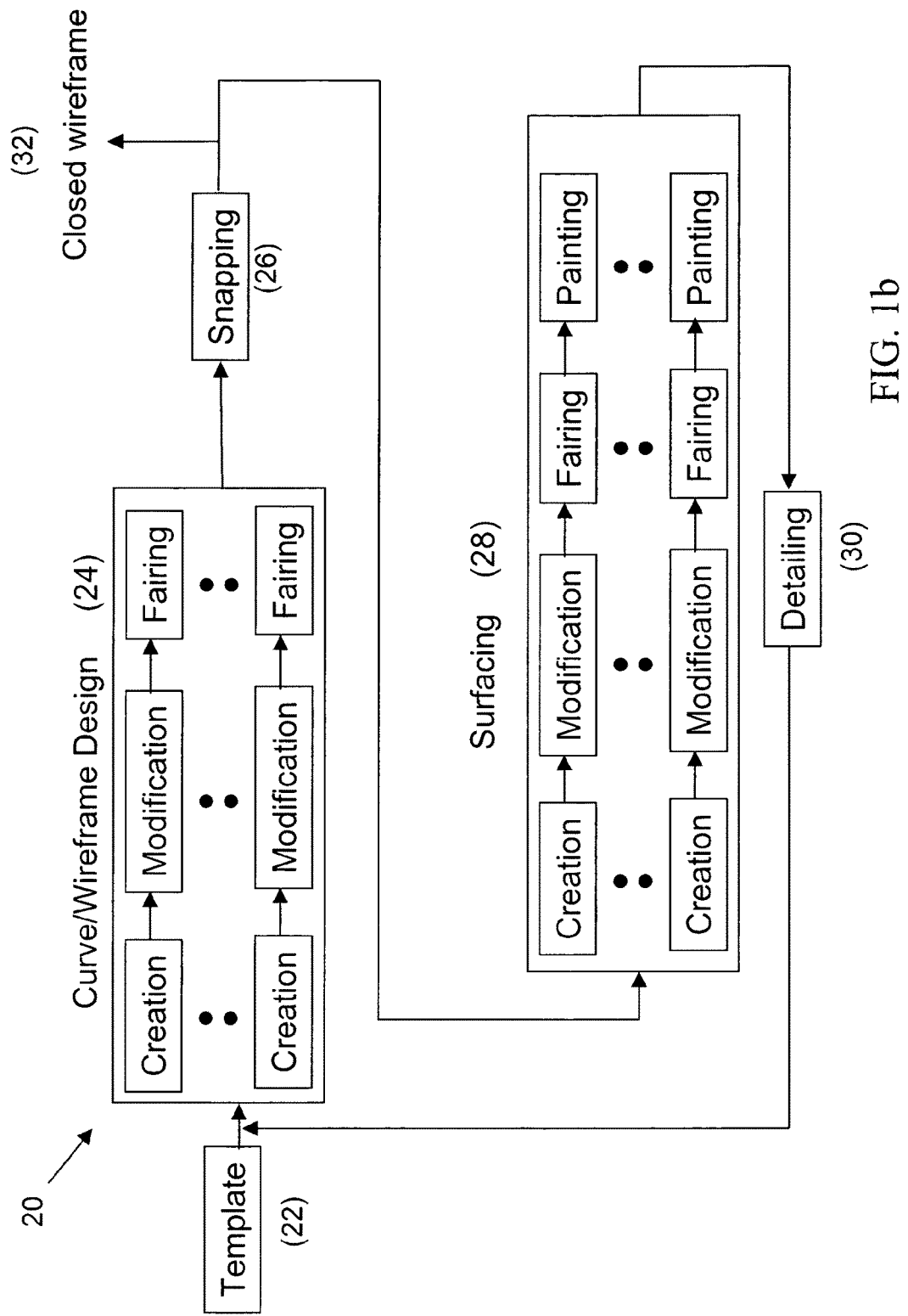
FIG. 1b is a schematic of a typical design process according to one embodiment of the present invention.

FIG. 1b shows a schematic of a typical design process 20 using the present invention. The process 20 includes creation or selection of a template 22, the curve/wireframe design 24, snapping 26, surfacing 28, and detailing 30. Other steps may also exist in addition to those identified herein. The curve/wireframe design may include, for example, creation, modification, and fairing. Surfacing 28 may include, for example, creation, modification, fairing, and painting. The snapping process 26 allows disconnected curves to be attached to one another to form a closed wireframe model 32. The design process may be considered as four main steps: selection or creation of a template 22, the curve/wireframe design 24, creating surfaces 28, and modifying and refining each surface patch 28. Both the third and fourth steps are included in "surfacing" 28 in FIG. 1b. The first step 22 is the initial layout step in which the user constructs the wireframe model of the design object through direct sketching on a base template. Alternatively, the user may select a template or a template may be selected for the user.

Figure 2:
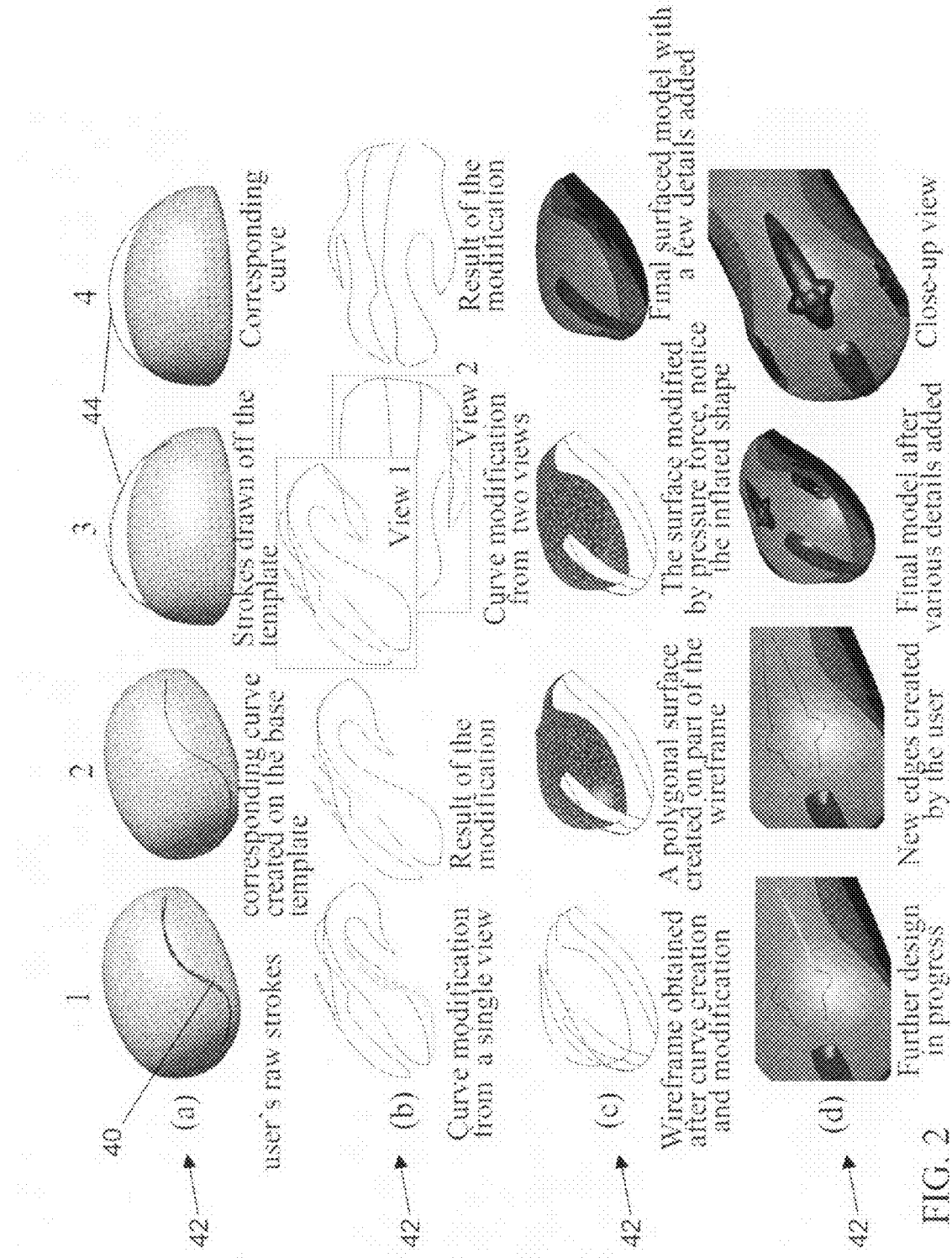
FIG. 2 illustrates modeling operations according to one embodiment of the present invention.

FIG. 2 illustrates modeling operations supported by the present invention. Labels for rows (letters) and columns (numbers) are used to facilitate reference from the text. Row (a) illustrates curve creation on and off the base template. Row (b) illustrates single, and two-view curve modification illustrated on arbitrary curves. In the single-view modification mode the curve is modified by strokes drawn from one particular view. In the two-view modification mode, the stroke information gathered from the two views are combined to produce the final modification. Row (c) illustrates surface creation and modification on a user-designed wireframe. Row (d) illustrates further design performed in a similar way. Curves of features are drawn, modified, and finally surfaced.

As shown in FIG. 2[a1], the user can lay down a curve 40 on the template 42 using multiple strokes, drawn in any direction and order, thus accommodating casual drawing styles such as overstroking. After drawing the strokes, the user invokes a command which processes and beautifies the collection of raw strokes into a smooth curve lying on the base template. FIG. 2 also illustrates the shape model 42 evolving from a template in FIG. 2a to a finished three dimensional shape model in FIG. 2d.

The base template 42 is typically a very simplified solid model of the design object in question. For instance, as shown in FIG. 2[a], a simple half-egg shape serves as a suitable template for the design of a computer mouse. Taking advantage of the depth buffer of the graphics engine, particularly its fast ray intersection capability, this template 42 provides a platform on which users' pen strokes can be conveniently captured in 3D space. Since the curves obtained this way lie directly on the template, the initial wireframe constructed at the end of this step will usually possess a roughly correct geometry and relative proportions. This, in turn, will greatly lessen the work involved in the subsequent step of wireframe modification. Besides these practical advantages, the use of a template also helps avoid the well-known challenge of one-to-many mapping in 3D interpretation from 2D input.

In addition to creating curves that lie entirely on the template, users can also create curves 44 that reside largely off the template 42, provided that their two ends lie on the template 42 (FIG. 2[a3,a4]). The best 3D configuration of the curve in this case is determined based on an energy minimization algorithm. As explained later, this algorithm forces the 3D curve to lie right under the input strokes (as expected), while minimizing its geometric complexity. In both of the above curve creation methods, the user has the option to specify a symmetry plane, which is typically one of the three principal cartesian planes. When a symmetry plane is activated, the work on one side of the symmetry plane is conveniently replicated symmetrically on the other side, thus expediting the design process.

The curves obtained in the first step 22 make up the initial wireframe or template 42 of the design object. In the second step 24, the user modifies the curves of the wireframe 42 to the desired shapes using a sketch-based modification technique. During this step, the user can safely remove the base template used in the first step 22, as this template is no longer required. To modify a curve, the user sketches the new shape of the curve directly on the computer screen. Based on the spatial proximity in the image plane (by "image plane", we mean the display screen on which the user both draws and views the model), the present invention first identifies the curve that the user intends to edit. Next, using an energy minimization algorithm similar to the one mentioned previously, it modifies the curve in 3D (FIG. 2[b1,b2]). The resulting curve, which we call the "minimum surprise curve," closely approximates the new shape dictated by the input strokes, while minimizing the deviation from the original 3D curve. As before, symmetry can be preserved across a user specified plane if necessary.

Besides providing the ability to modify a curve from a single viewpoint, the present invention also allows a curve to be modified from two different and arbitrary viewpoints (FIG. 2[b3,b4]). In this case, the user sketches the new shape of a curve separately in the two views. As explained later, the information gathered from these two views is combined to produce the new 3D shape of the curve. This feature is advantageous especially when the desired curve possesses 3D geometry that is hard to depict from a single viewpoint.

At the end of the first two steps 22, 24, the user obtains a wireframe model 42 where each of the constituent curves has been accurately designed. In the third step 28, the user constructs surfaces on the desired loops of the wireframe to obtain a solid model 42 (FIG. 2[c]). The initial surfaces laid on the wireframe have a common property of being minimum-area surfaces, which is analogous to the way a soap film would stretch across a wire loop. In the fourth step of the design, each surface patch is modified and refined using two physically-based deformation tools. The first tool, inspired by the deformation of a thin membrane under a pressure force, allows the user to inflate or flatten a surface by a controllable amount (FIG. 2[c3]). The amount of pressure applied to a surface can be controlled by the user through a simple slider bar (or other form of input) located in the user interface. The intuitive nature of this deformation tool enables different surface shapes to be quickly and straightforwardly explored. Surfaces may also be modified using a method inspired by mechanical springs. This method works to minimize the variation of mean curvature, producing surfaces that are fair and aesthetically pleasing.

While the above four design steps nominally take place sequentially, at any time the user can go back to an earlier step to add new curves or modify existing ones. This flexibility allows users to later add details to the model 42. In this case, the surfaces created by the user can be used as suitable platforms to create new curves, thus eliminating the need for the base template used in the first step. Newly added curves can then be modified and later surfaced using the same techniques outlined above.

In addition to those discussed above, the present invention allows for many variations, modifications, and other applications. For example, the present invention may be used to align a three dimensional computer model of an object with a scanned or digitally created two dimensional sketch of the object. The present invention also includes a method for constructing smooth two dimensional curves from a set of input strokes. The present invention also includes a sketch-based method for modifying two dimensional curves using multiple stokes. Those and other variations, modifications, and applications will be discussed hereinbelow.

2. A Method for Aligning a 3D Computer Model of an Object with a Scanned or Digitally Created 2D Sketch of the Object This aspect of the invention allows users to import and trace over existing 2D sketches to generate 3D geometry. For this, a 3D wireframe model is geometrically aligned with the 2D sketch such that the 3D wireframe lies right beneath the 2D sketch with the correct vantage point and perspective. Users' subsequent strokes tracing the sketch are then used to modify the wireframe directly in 3D.

This method can accurately and rapidly align the wireframe and the sketch using six or more key points (corners of a virtual bounding box of the sketched model) marked by the user. The method is not limited to preferred vantage points, and is applicable to both perspective and orthogonal drawings of an object.

Figure 3:
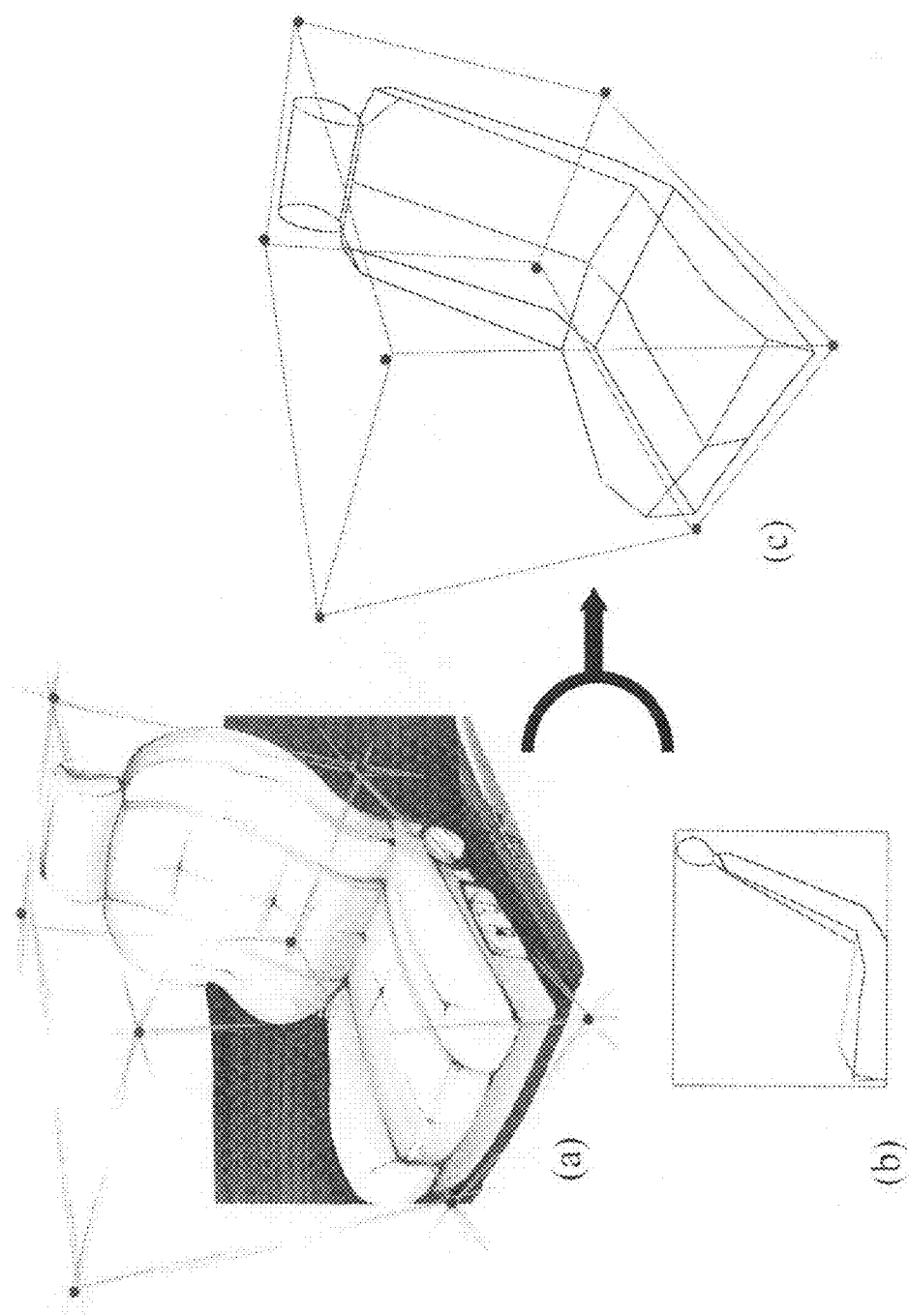
FIG. 3 illustrates template alignment according to one embodiment of the present invention.

FIG. 3 illustrates template alignment according to one embodiment of the present invention. In this embodiment, (a) the user draws an approximate bounding box on the sketch and marks its eight corners. (b) The default configuration of the template is an orthographic side view. (c) The camera calibration algorithm closely aligns the template with the sketch. In an ideal alignment, the corners of the template bounding box would exactly match the dots marked by the user.

To align the template with the sketch, the user is asked to draw a bounding box enclosing the object in the sketch, and mark its eight corners. It is assumed that the sketch is depicted from a general viewpoint with all eight corners of the bounding box distinctly revealed. The 2D coordinates of the eight corner points set up a camera calibration algorithm that aligns the user-drawn bounding box with that of the template. Drawing the bounding box provides a visual guide to the user and is optional. Other variations of the invention may be used. Adopting the convention used in FORSYTH, D. A., AND PONCE, J. 2003. *Computer Vision: a Modern Approach*. Prentice Hall., the camera model relating a homogeneous world coordinate $P=[x\ y\ z\ 1]^T$ to a homogeneous image coordinate $p=[u\ v\ 1]^T$ can be described as follows:

$$p = \frac{1}{s}K[R\ t]P$$

where s is an unknown scale factor. R and t are the extrinsic camera properties corresponding to the rotation and translation matrices. K is the camera intrinsic matrix and is given by:

$$K = \begin{bmatrix} \alpha & -\alpha\cot(\theta) & u_0 \\ 0 & \dfrac{\beta}{\sin(\theta)} & v_0 \\ 0 & 0 & 1 \end{bmatrix}$$

with $(u_0, v_0)$ the coordinates of the camera center, $\alpha$ and $\beta$ the scale factors in image u and v axes, and $\theta$ the skew angle in radians between the two image axes. Given the eight corner points indicated by the user and the corresponding eight world coordinates of the template corners, the goal is to reliably identify matrices K, R, t, and the unknown scalar s. Once these parameters are determined, they can be applied to the virtual camera directed at the template to align the projection of the template with the sketch.

The calibration process can be decomposed into two parts [FORSYTH, D. A., AND PONCE, J. 2003. *Computer Vision: a Modern Approach*. Prentice Hall.]: (1) Computing a 3×4 projection matrix M; the product $(1/s) \cdot K \cdot [Rt]$, (2) Estimating intrinsic and extrinsic parameters from M.

For the solution of the first part, we use the Linear Direct Transform method [ABDEL-AZIZ, Y., AND KARARA, H. 1971. Direct linear transformation from comparator coordinates into object space coordinates in close-range photogrammetry. In *Symposium on Close-Range Photogrammetry, American Society of Photogrammetry*, 1-18]. In this method, n image coordinates and their corresponding n world coordinates yield a system of 2n homogenous linear equations in the twelve unknown coefficients of M. When $n \geq 6$ (in our case n is 8), the twelve coefficients can be obtained in the least-squares sense as the solution of an eigenvalue problem.

The second step extracts s, K, R and t from M. This is facilitated by the fact that the rows of the rotation matrix have unit length and are orthonormal. The unknown camera parameters can be found as follows (see [FORSYTH, D. A., AND PONCE, J. 2003. *Computer Vision: a Modern Approach*. Prentice Hall.] for more details): rewrite $M = [A_{3\times3} b_{3\times1}]$. Note that A and b are trivially determined from M. Let $a_1$, $a_2$ and $a_3$ be the three column vectors of A. Let $r_1$, $r_2$ and $r_3$ be the three unknown column vectors of R. Then:

$$s = \pm 1/\|a_3\|,$$

$$r_3 = sa_3,$$

$$u_0 = s^2(a_1 \cdot a_3),$$

$$v_0 = s^2(a_2 \cdot a_3),$$

$$\cos(\theta) = -\frac{(a_1 \times a_3) \cdot (a_2 \times a_3)}{\|a_1 \times a_3\| \cdot \|a_2 \times a_3\|},$$

$$\alpha = s^2 \|a_1 \times a_3\| \cdot \sin(\theta),$$

$$\beta = s^2 \|a_2 \times a_3\| \cdot \sin(\theta),$$

$$r_1 = \frac{a_2 \times a_3}{\|a_2 \times a_3\|},$$

$$r_2 = r_3 \times r_1,$$

$$t = s \cdot K^{-1} b$$

Two R matrices can be computed depending on the sign of s. Typically, the sign of tz is known in advance; it is positive if the origin of the world coordinate system is in front of the camera. An inspection of the computed t vector thus allows a unique selection of R. FIG. 3 shows the calibration result for a car seat.

Compared to alternative methods, such as a manual alignment of the template, this calibration method has the advantage that extrinsic and intrinsic camera parameters can be simultaneously computed. While manually adjusting the position and orientation of the template might be feasible, a manual calibration of the intrinsic parameters is not trivial. One key issue in the above approach, however, is whether designers can accurately portray the bounding box in the sketch, and if not, how sensitive the approach is to such inaccuracies. Our informal observations involving several users have indicated that most can draw bounding boxes accurately enough, especially for sketches exhibiting conventional vantage points. Nevertheless, even if the user's depiction of the bounding box is quite inaccurate, the least-squares nature of the calibration yields satisfactory results in most practical settings.

Once the template is aligned with the sketch using this method, the resulting intrinsic and extrinsic camera properties can be saved in a text file, and can later be recalled with a single button click. As the results are available for later use, the user has to perform calibration only once throughout the design cycle. This is especially useful where multiple sketches depicting different vantage points are used for design. In such cases, the user may calibrate the template separately once for each sketch. During the design process, individual calibration data can be quickly retrieved, thus allowing a fluid switching between different sketches.

While the bounding box provides a suitable set of eight points that facilitates calibration, the approach can be extended to a more general setting using a more obvious set of calibration points. For instance, instead of using the bounding box corners of a car seat, one may elect to use the bottom four corners of the seat base, the intersection points of the base and the backrest, the intersection points of the backrest and the headrest, etc. Likewise, in car body design, the centers of the four wheels, the corners of the roof, the intersection points between the hood and the windshield etc., can be used as suitable calibration points. As long as six or more such points can be identified (preferably dispersed around the entirety of the object to achieve the best overall fit), the above algorithm can be readily applied without any modification. For a given design object, however, the user must know which points are used by the algorithm so as to be able to mark the corresponding points on the sketch.

As described above, the previous alignment procedure requires a minimum of six fiducial points to be specified by the user. This is because the alignment algorithm needs to simultaneously identify both extrinsic and intrinsic camera properties. However, in certain cases, apriori information about the intrinsic camera properties might be available to the alignment algorithm. For instance, it might be known that the object's sketch was created under isometric projection (i.e., no perspective), or that the camera is centered perfectly and there is no skew between the camera axes. In such cases, only three fiducial points are necessary to identify unknown extrinsic camera properties. In particular, when the intrinsic camera parameters are known, the alignment problem can be posed as a three-point perspective pose estimation problem where the camera configuration relative to the 3d object is computed [Gao, X., Hou, X., Tang, J., and Cheng, H. 2003. Complete Solution Classification for the Perspective-Three-Point Problem. *IEEE Trans. Pattern Anal. Mach. Intell.* 25, 8 (August 2003), 930-943. DOI=http://dx.doi.org/10.1109/TPAMI.2003.1217599]. Hence in the present invention, when the intrinsic camera parameters implied in the object's sketch are known, template alignment can be performed using as few as three fiducial points. A key, however, is that these fiducial points have to be non-collinear.

Other variations are possible with the present invention, such as alignment using a numbers of key points other than three or six.

3. A Method for Constructing Smooth 2D Curves from a Set of Input Strokes Drawn in Arbitrary Orders and Direction This aspect of the invention beautifies input pen strokes into smooth curves. The method can handle multiple strokes drawn in arbitrary directions and order. The resulting curve closely approximates input strokes.

Two types of curves can be created using this method: cubic B-splines and physically based, free-form curves.

The difficulty arising from multiple strokes drawn in arbitrary directions and order is solved using an eigen-analysis. This analysis is used to geometrically sort an unordered set of points extracted from the pen strokes. This sorting is essential to the subsequent curve construction process.

Figure 4:
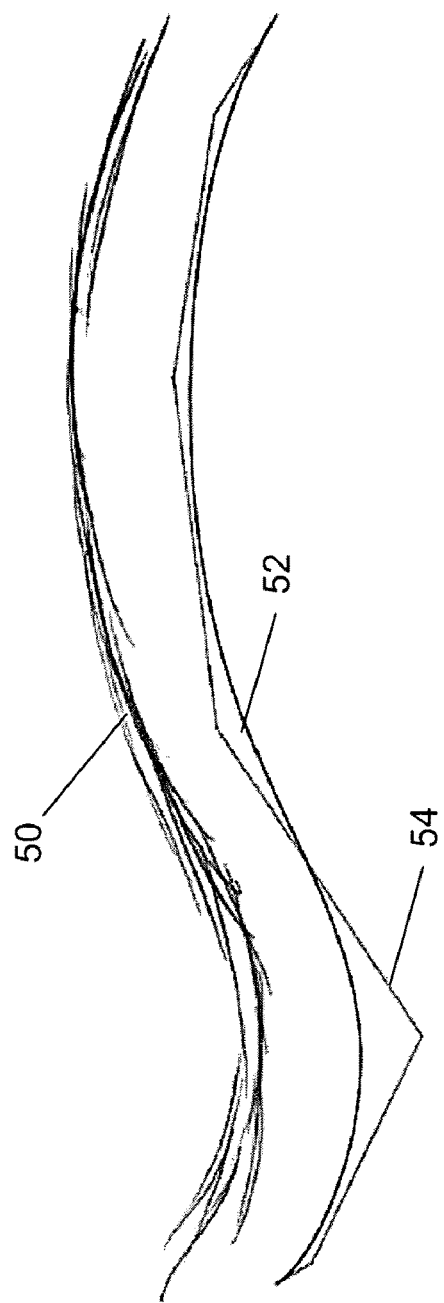
FIG. 4 shows an example and illustrates B-spline fitting to raw strokes, in which the top part of the figure is the input strokes, and the bottom part of the figure is the resulting B-spline and its control polygon.

Given the input strokes in the image plane, we first fit a B-spline to the collection of strokes using a minimum least-squares criterion described in [PIEGL, L., AND TILLER, W. 1997. *The NURBS Book.*]. FIG. 4 shows an example and illustrates B-spline fitting to raw strokes, in which the top part of the figure is the input strokes 50, and the bottom part of the image is the resulting B-spline 52 and its control polygon 54. By default, we use cubic B-splines with seven control points. While these choices have been determined empirically to best suit our purposes, they can be adjusted to obtain the desired balance between the speed of computation, the smoothness of the curve, and the approximation accuracy. Nevertheless, details of the curve fitting process and the resulting auxiliary features, such as the curve's control polygon, are hidden from the user. The user is only presented with the resulting curve.

Normally, the data points used for curve fitting would be those sampled along the stylus' trajectory. However, fluctuations in the drawing speed often cause consecutive data points to occur either too close to, or too far away from one another. This phenomenon, as evidenced by dense point clouds near the stroke ends (where drawing speed tends to be low) and large gaps in the middle of the stroke (where speed is high), often adversely affects curve fitting. Hence, before curve fitting is applied, we resample each stroke to obtain data points equally spaced along the stroke's trajectory.

The main challenge in curve fitting, however, arises from the fact that a curve can be constructed using multiple strokes, drawn in arbitrary directions and orders. This arbitrariness often causes spatially adjacent data points to have markedly different indices in the vector storing the data points. An accurate organization of the data points based on spatial proximity, however, is a strict requirement of the curve fitting algorithm. Hence, prior to curve fitting, input points must be reorganized to convert the cloud of unordered points into an organized set of points. Note that this reorganization would only affect the points' indices in the storage vector, not their geometric locations.

Figure 5:
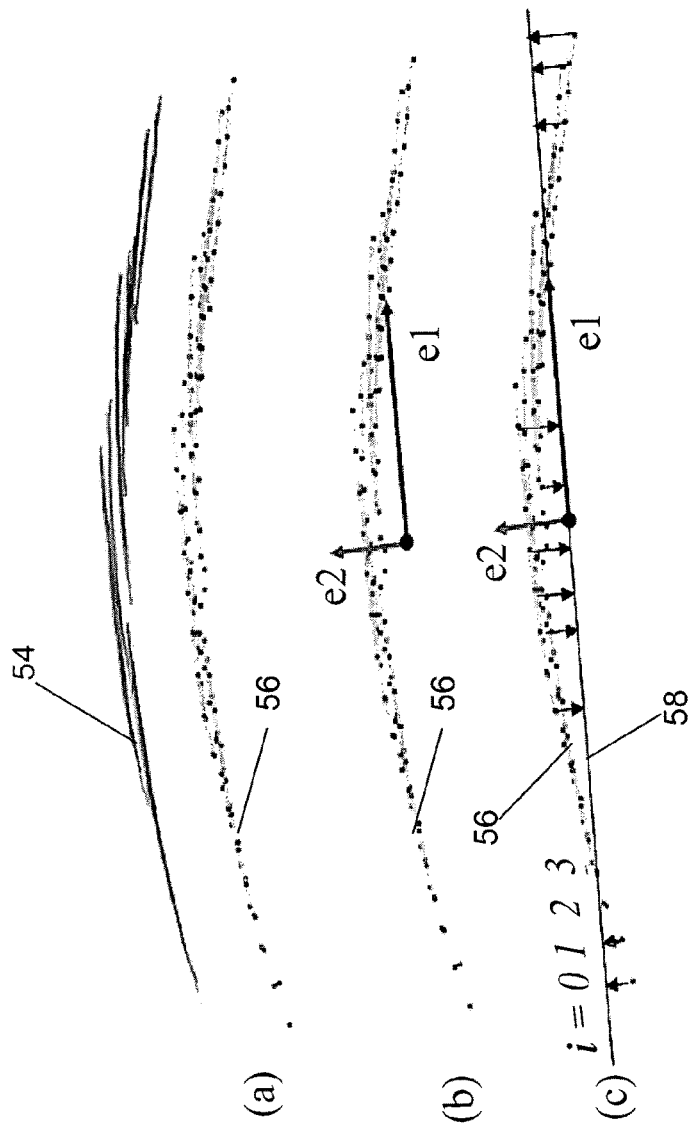
FIG. 5 illustrates point ordering using principal component analysis according to one embodiment of the present invention.

To this goal, we use a principal component analysis as shown in FIG. 5. FIG. 5 illustrates point ordering using principal component analysis. FIG. 5(a) illustrates input strokes 50 and extracted data points 56. FIG. 5(b) illustrates the two principal component directions are computed as the eigenvectors of the covariance matrix of the data points. The two direction vectors are positioned at the centroid of the data points 56. FIG. 5(c) illustrates data points are projected onto the first principal direction e1, and sorted.

The main idea is that, by identifying the direction of maximum spread of the data points 56, one can obtain a straight line approximation to the points. Next, by projecting the original points onto this line and sorting the projected points, one can obtain a suitable ordering of the original points.

Given a set of 2D points, the two principal directions can be determined as the eigenvectors of the 2×2 covariance matrix $\Sigma$ given as:

$$\sum = \frac{1}{n}\sum_{k=1}^{n}(x_k - \mu)(x_k - \mu)^T$$

Here, $x_k$ represents the column vector containing the (x;y) coordinates of the k'th data point, and $\mu$ is the centroid of the data points.

The principal direction we seek is the one that corresponds to maximum spread, and is the eigenvector associated with the larger eigenvalue. After identifying the principal direction, we form a straight line 58 passing through the centroid of the data points and project each of the original points onto the principal line. Next, we sort the projected points according to their positions on the principal line 58. The resulting ordering is then used as the ordering of the original points. Note that one advantageous byproduct of this method is that it reveals the extremal points of the curve (i.e., its two ends), which would otherwise be difficult to identify.

In practice, we have found this approach to work well especially because the curves created with the present invention often stretch along a unique direction. Hence, the ordering of the projections along the principal direction often matches well with the expected ordering of the original data points. However, this method falls short when users' curves exhibit hooks at the ends, or contain nearly-closed or fully-closed loops.

This is because these artifacts will cause folding or overlapping of the projected points along the principal direction, thus preventing a reliable sorting. To circumvent such peculiarities, we ask users to construct such curves in pieces consisting of simpler curves; the present invention allows separate curves to be later stitched together using a trim function.

4 A Sketch-Based Method for Modifying 2D Curves Using Multiple Strokes

This aspect of the invention allows users to modify 2D curves 60 with sketch input 62. To modify a curve 60, the user sketches the new shape 62 near the existing curve 60. The curve then gets modified such that it closely approximates the modifier strokes 62 while maintaining its smoothness.

The method allows the user to control curve smoothness versus stroke interpolation through intuitive weights.

This method allows pen pressure to be utilized as an additional source of information during curve modification. Strokes drawn with high pen pressure are weighted more heavily than those drawn with lighter pressure. Pen speed can also be used as such source of information.

We deform a projected target curve 60 in the image plane using an energy minimizing algorithm based on active contour models [KAAS, M., WITKINS, A., AND TERZOPOLUS, D. 1988. Snakes: active contour models. *International Journal of Computer Vision* 1, 4, 312-330.]. Active contours (also known as snakes) have long been used in image processing applications such as segmentation, tracking, and registration. The principal idea is that a snake moves and conforms to certain features in an image, such as intensity gradient, while minimizing its internal energy due to bending and stretching. This approach allows an object to be extracted or tracked in the form of a continuous spline.

Our method adopts the above idea for curve manipulation. Here, the target curve 60 is modeled as a snake, whose nodes are sampled directly from the target curve 60. The nodes of the snakes are connected to one another with line segments making the snake 60 geometrically equivalent to a polyline. The set of modifier strokes 62, on the other hand, is modeled as an unordered set of points (point cloud) extracted from the input strokes.

Figure 6:
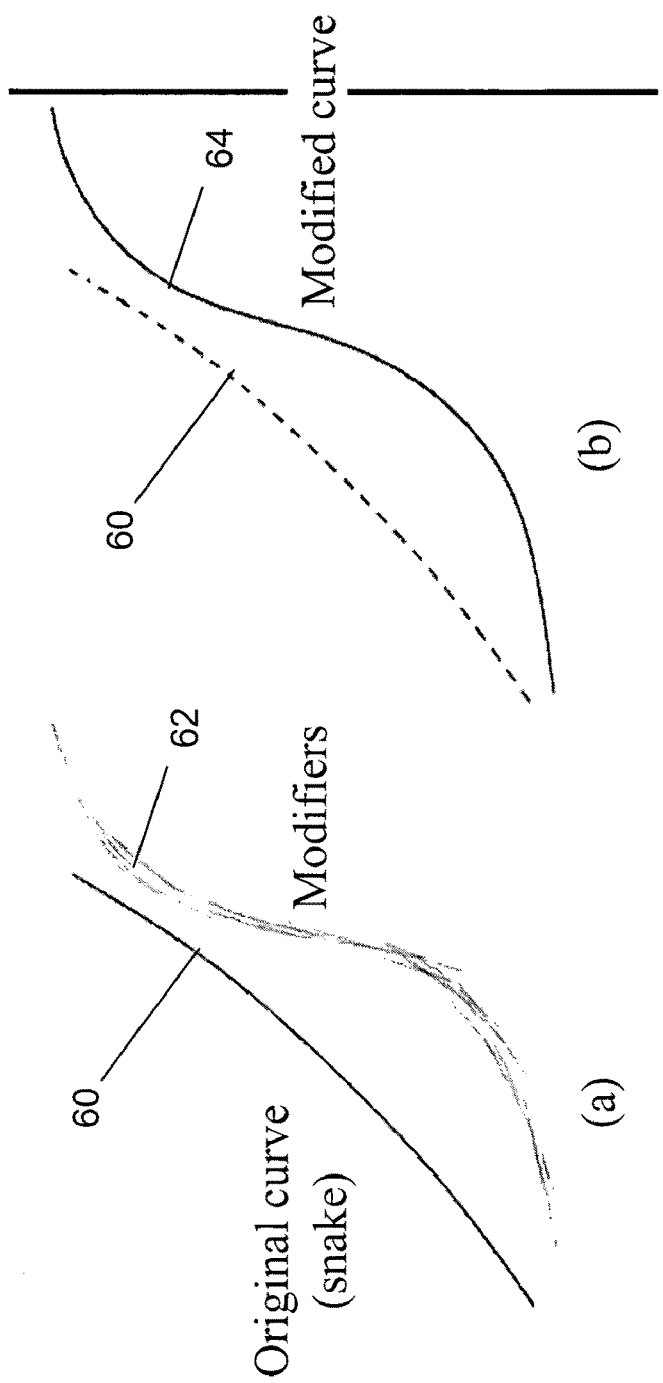
FIG. 6 illustrates modification of a two dimensional curve according to one embodiment of the present invention.
Figure 7:
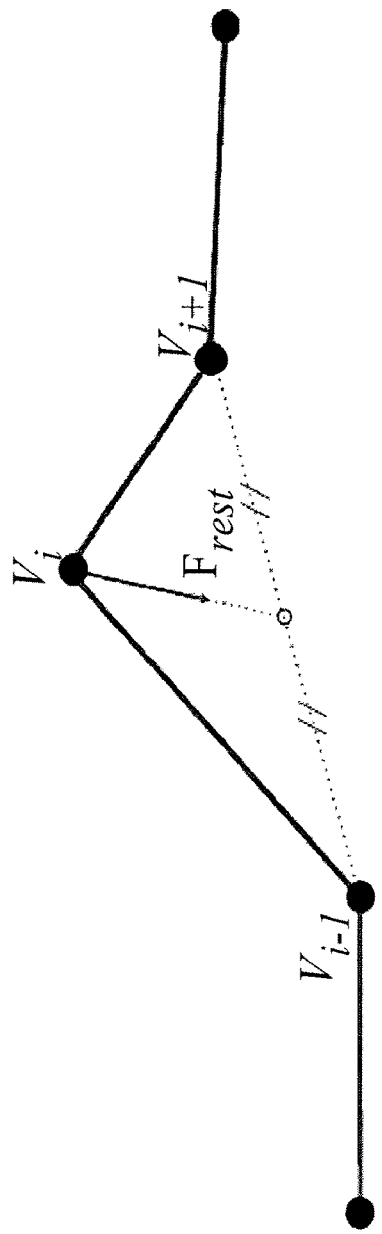
FIG. 7 illustrates how internal energy due to stretching and bending is minimized according to one embodiment of the present invention.

This allows for an arbitrary number of modifiers, drawn in arbitrary directions and order, thus accommodating casual drawing styles. With this formulation, the snake converges to the shape of the modifiers 62, but locally resists excessive bending and stretching to maintain smoothness, as illustrated in FIG. 6. In particular, FIG. 6(a) illustrates the original curve and the modifier strokes. FIG. 6(b) illustrates the new shape 64 of the target curve. The original curve is shown dashed 60 for reference. Mathematically, this can be expressed as an energy function to be minimized:

$$E_{snake} = \sum_i E_{int}(v_i) + E_{ext}(v_i)$$

where $v_i=(x_i,y_i)$ is the i'th node coordinate of the snake. $E_{int}$ is the internal energy arising from the stretching and bending of the snake. It involves first and second order derivatives of $v_i$ with respect to arc length. Since minimizing $E_{int}$ in its original form is computationally intensive, we resort to a simpler approximate solution of applying a restitutive force $F_{rest}$ which simply moves each snake node toward the barycenter of its neighboring two nodes as illustrated in FIG. 7. In particular, FIG. 7 illustrates internal energy due to stretching and bending is minimized approximately by moving each snake node to the barycenter of its neighbors similar to Laplacian smoothing. However, to prevent the snake from shrinking indefinitely, its two ends are pinned to the two extremal points of the modifiers prior to modification.

External energy $E_{est}^i$ describes the potential energy of the snake due to external attractors, which arise in the presence of modifiers. The modifiers' influence on the snake consists of two components: (1) location forces, (2) pressure forces. The first component moves the snake toward the data points sampled from the modifiers.

Figure 8:
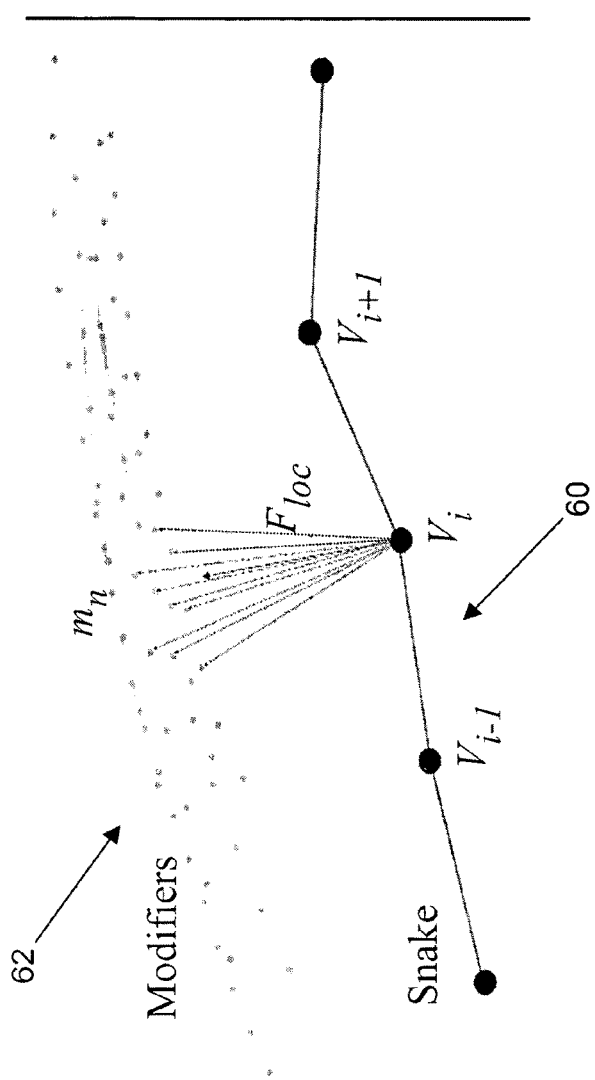
FIG. 8 illustrates location force on a node according to one embodiment of the present invention.

For each snake node $v_i$, a force $F_{loc}(v_i)$ is computed corresponding to the influence of the location forces on $v_i$:

$$F_{loc}(v_i) = \sum_{n \in k\_neigh} \frac{m_n - v_i}{\|m_n - v_i\|} \cdot w(n)$$

where $m_n$ is one of the k closest neighbors of $v_i$ in the modifiers, as illustrated in FIG. 8 which shows location force on a node. w(n) is a weighting factor inversely proportional to the distance between $m_n$ and $v_i$. In other words, at any instant, a snake node $v_i$ is pulled by k nearest modifier points. The force from each modifier point $m_n$ is inversely proportional to its distance to v, and points along the vector $m_n-v_i$. Using k neighbors has the desirable effect of suppressing outliers, thus directing the snake toward regions of high ink density.

The second component of $E_{ext}$ is related to pressure with which strokes are drawn. The force created due to this energy pulls the snake toward sections of high pressure. The rationale behind considering the pressure effect is based on the observation that users typically press the pen harder to emphasize critical sections while sketching. The pressure term exploits this phenomenon by forcing the snake to favor sections drawn more emphatically. For each snake node $v_i$, a force $F_{pres}(v_i)$ is computed as:

$$F_{pres}(v_i) = \sum_{n \in k\_neigh} \frac{m_n - v_i}{\|m_n - v_i\|} \cdot p(n)$$

where p(n) is a weight factor proportional to the pen pressure recorded at point $m_n$.

During modification, the snake moves under the influence of the two external forces while minimizing its internal energy through the restitutive force. In each iteration, the new position of $v_i'$ is determined by the vector sum of $F_{rest}$, $F_{loc}$ and $F_{pres}$, will result in smoother curves with less bends. On the other hand, emphasizing $F_{pres}$ will increase the sensitivity to pressure differences with the resulting curve favoring high pressure regions.

5 A Sketch-Based Method for Creating Smooth 3D Curves Using Multiple Strokes

This aspect of the invention converts users' strokes into smooth 3D curves. There are two ways of creating such curves: creating curves entirely on a 3D surface template, and creating curves in space.

When creating curves entirely on a 3D surface template, users' strokes are first beautified into 2D smooth curves on the sketching plane using the method described in section 3. The newly created 2D curve is then transformed into 3D by projecting the curve onto a 3D template model using a readily available ray-tracing algorithm.

When creating curves in space, an unconstrained smooth 3D curve can be created so long as the curve's two end points lie on a 3D surface template. The two end points are used to anchor the curve in 3D. The main challenge of determining the 3D configuration of the curve's body is solved using a physically based 3D curve deformation algorithm.

In the first step of the design, the user constructs the wireframe by sketching its constituent 3D curves. Unlike many of the previous approaches, the present invention allows curves to be created with an arbitrary number of strokes, drawn in any direction and order. With this in hand, the present invention offers two methods for creating curves based on whether the curves are instantiated entirely on the base template, or otherwise.

5.1 Creating Curves on the Template

In this method, users create curves directly on the base template. The process consists of two main steps. The first is a beautification step in which we identify a smooth B-spline that closely approximates the input strokes in the image plane. In the second step, the 2D curve obtained in the image plane is projected onto the template resulting in a 3D curve.

Once the raw strokes are beautified into a B-spline, the resulting curve is projected onto the base template. This is trivially accomplished using the depth buffer of the graphics engine. At the end, a 3D curve is obtained that lies on the template, whose projection to the image plane matches with the user's strokes (FIG. 2[a2]).

5.2 Creating Curves in Space

Figure 9:
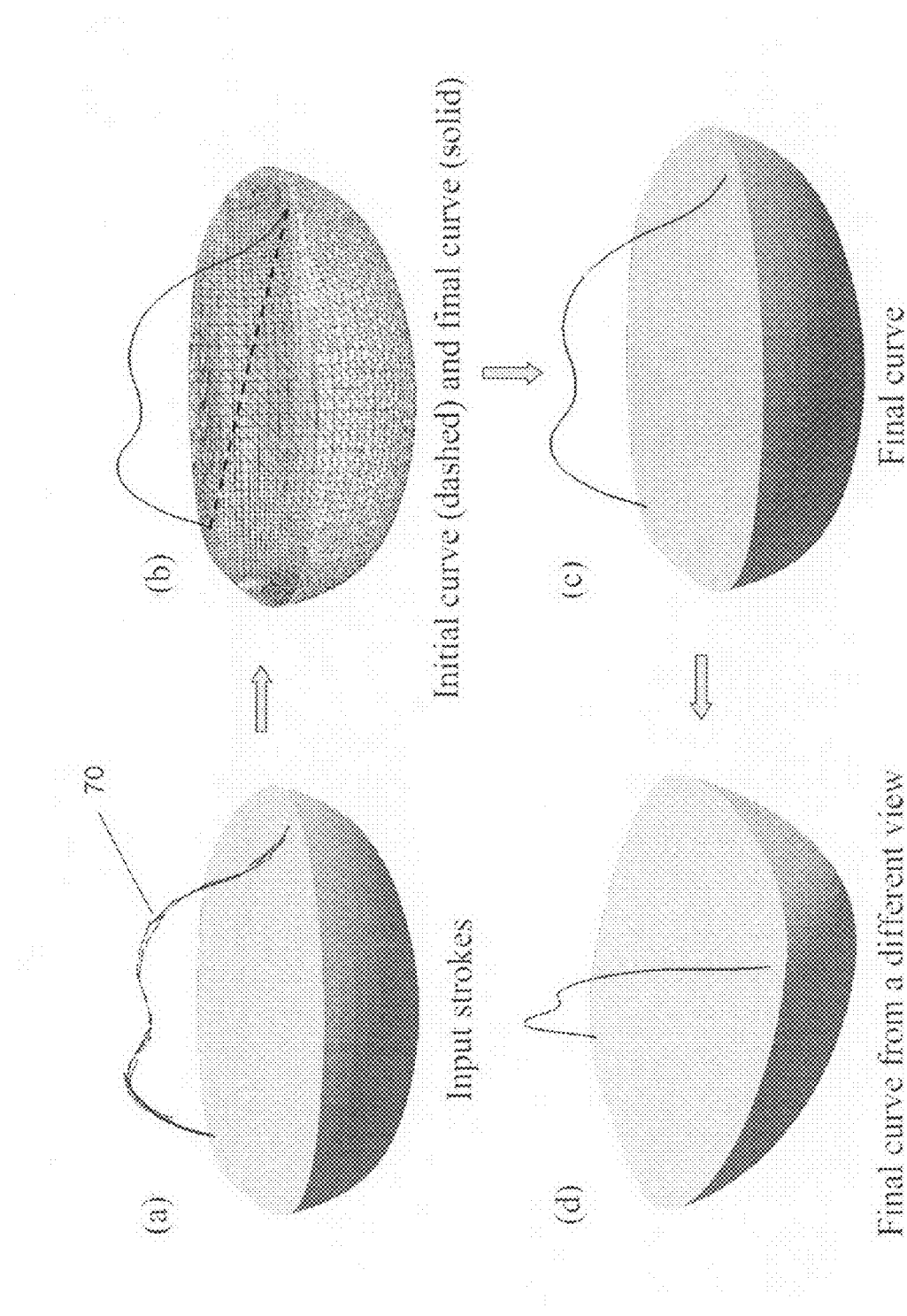
FIG. 9 illustrates curve construction off the template according to one embodiment of the present invention.

Users can also create curves that lie mostly off the template, provided that their two end points lie on the template, as illustrated in FIG. 9. In particular, FIG. 9 illustrates curve construction off the template. FIG. 9(a) illustrates the input strokes 70. FIG. 9(b) illustrates the initial 3D curve (dashed line) instantiated as a straight line between the extremal points, and the final 3D curve (solid line) obtained after modification of the initial curve using snake-based energy minimization. FIGS. 9(c) and 9(d) illustrate two views of the resulting curve.

As before, a curve can be constructed with multiple strokes drawn in arbitrary directions and order. In this case, the intersection of the curve ends with the template helps anchor the ends of the curve in 3D. The main challenge, however, is to identify the best 3D configuration of the curve's body, which likely lies off the template. This is because, unlike in the previous case, there is no reference object in 3D that can be used to capture the parts of the curve that lie off the template. Hence, there are infinitely many curves whose projections would match the user's strokes in the given view. As a result, the best 3D configuration of the curve must be chosen based on certain constraints.

Trivially, we would expect the entirety of the 3D curve to lie right under the input strokes. Additionally, out of infinitely many possible such curves, we elect to favor curves with reasonably simple geometry. Under these premises, our solution is based on an energy minimization algorithm that has active contours [KAAS, M., WIIKINS, A., AND TERZOPOLUS, D. 1988. Snakes: active contour models. *International Journal of Computer Vision* 1, 4, 312-330.] at its heart. The next section concerning curve modification provides a detailed description of active contours and their usage in the present invention. We therefore defer a detailed discussion until later. Nevertheless, below we provide an overview of the method.

Imagine the user wants to modify an existing 3D curve by sketching its new shape on the display. The present invention provides a way to accomplish this as follows: First, the existing 3D curve is projected to the image plane producing a 2D curve. This projection is precisely the curve that the user normally sees on the display screen. Next, using an energy minimization technique, the projected curve is forced to change its shape until it closely conforms to the strokes sketched by the user. The result is that the projected 2D curve now takes on the new shape specified by the user's strokes. Finally, the new 2D curve is projected back into 3D, resulting in the new 3D curve. As noted previously, there are infinitely many such projections. The key here is that we perform projection back into 3D in a way that produces a curve that deviates minimally from the original 3D curve. We have found this choice to produce convincing results in the majority of cases.

While the above idea is used primarily to modify existing curves, we also use it to create curves in 3D. In this case, we use the two points obtained by intersecting the curve ends with the base template to instantiate a straight line between the two points as shown in FIG. 9b. This process provides a suitable initial 3D curve, thereby converting the task of curve creation into a task of curve modification. The user's strokes describing the desired curve shape are then simply treated as modifiers that change this initial curve. FIGS. 9c and d show two different views of the resulting curve. Note that unlike other approaches that assume a work plane perpendicular to the viewing direction, those that resort to symmetry constraints, or those that require curves to be drawn from multiple views, our approach allows curves to be created from a single view, directly in 3D, with varying depth coordinates. Moreover, the resulting curves conform precisely to the shape dictated by the user, while exhibiting convincing forms when viewed from different viewpoints. Although the latter is a subjective assessment, it is based on the premise that visually simpler shapes are preferable over those with complex artifacts, e.g. bends along the viewing direction. In the present invention, simplicity during curve creation is achieved by minimizing the deviation from a straight line.

6 A Sketch-Based Method for Modifying 3D Curves

This aspect of the invention allows users to modify the curves of a 3D wireframe model by sketching the new shape of the curves from arbitrary vantage points. The method is not constrained to preferred drawing planes or projection planes.

The method determines the new 3D shape of a curve as follows: the original 3D curve is projected to the drawing plane as a 2D curve; the user's strokes modify the projected curve in the 2D drawing plane using the invention described under Section 4; and the modified 2D curve is projected back into 3D by minimizing the spatial deviation from the original curve, while constraining the new curve to lie on a virtual surface computed from the current vantage point and the newly formed 2D curve.

Several modification schemes have been devised. A single-view modification scheme and a two-view modification scheme will be described in detail. Modification schemes using more than two views, or variations on the single-view and two-view scheme, may also be used with the present invention. In the single-view modification scheme, users modify a curve from a single arbitrary vantage point. In the two-view modification, users modify a curve by drawing the new shape of the curve from two arbitrary but distinct vantage points. In the two-view modification scheme, the new configuration of the curve is computed by intersecting the two virtual surfaces mentioned above under this section—Section 6.

After creating the initial wireframe, the user begins to modify its constituent curves to give them the precise desired shape. During this step, the base template can be removed, leaving the user with a set of 3D curves.

Two methods can be used to modify a curve. The first is by sketching the new curve in a single view. In the second method, the user sketches the curve from two arbitrary views. This second method is advantageous when it is difficult to depict the desired 3D shape of the curve using a single view. In both methods, we use an energy minimization algorithm to obtain the best modification of the curve in question.

To make matters simple, we designed our approach such that the curves of the wireframe are modified one at a time, with freedom to return to an earlier curve. At any point, the curve that the user intends to modify is determined automatically as explained below, thus allowing the user to modify edges in an arbitrary order. After each set of strokes, the user presses a button that processes accumulated strokes, and modifies the appropriate curve. To facilitate discussion, we shall call users' input strokes as modifiers, and the curve modified by those modifiers as the target curve.

6.1 Single-View Modification

Modification of the wireframe is performed in three steps. In the first step, curves of the wireframe are projected to the image plane resulting in a set of 2D curves. The curve that the user intends to modify is computed automatically by identifying the curve whose projection in the image plane lies closest to the modifier strokes. The proximity between a projected curve and the modifiers is computed by sampling a set of points from the curve and the modifiers, and calculating the aggregate minimum distance between the two point sets. In the second step, the target curve is deformed in the image plane until it matches well with the modifiers. In the third step, the modified target curve is projected back into 3D space.

6.1.1 Unprojection to 3D

In this step, the newly designed 2D curve is projected back into 3D space. As mentioned previously, there is no unique solution because there are infinitely many 3D curves whose projections match the 2D curve. We therefore choose the best 3D configuration based on the several constraints: Different types of constraints may also be used, or the same constraints may be applied in a different order.

First, the 3D curve should appear right under the modifier strokes.

Second, if the modifier strokes appear precisely over the original target curve, i.e., the strokes do not alter the curve's 2D projection, the target curve should preserve its original 3D shape.

Third, if the curve is to change shape, it must maintain a reasonable 3D form. By "reasonable," we mean a solution that the designer would accept in many cases, while anticipating it in the worst case.

Figure 10:
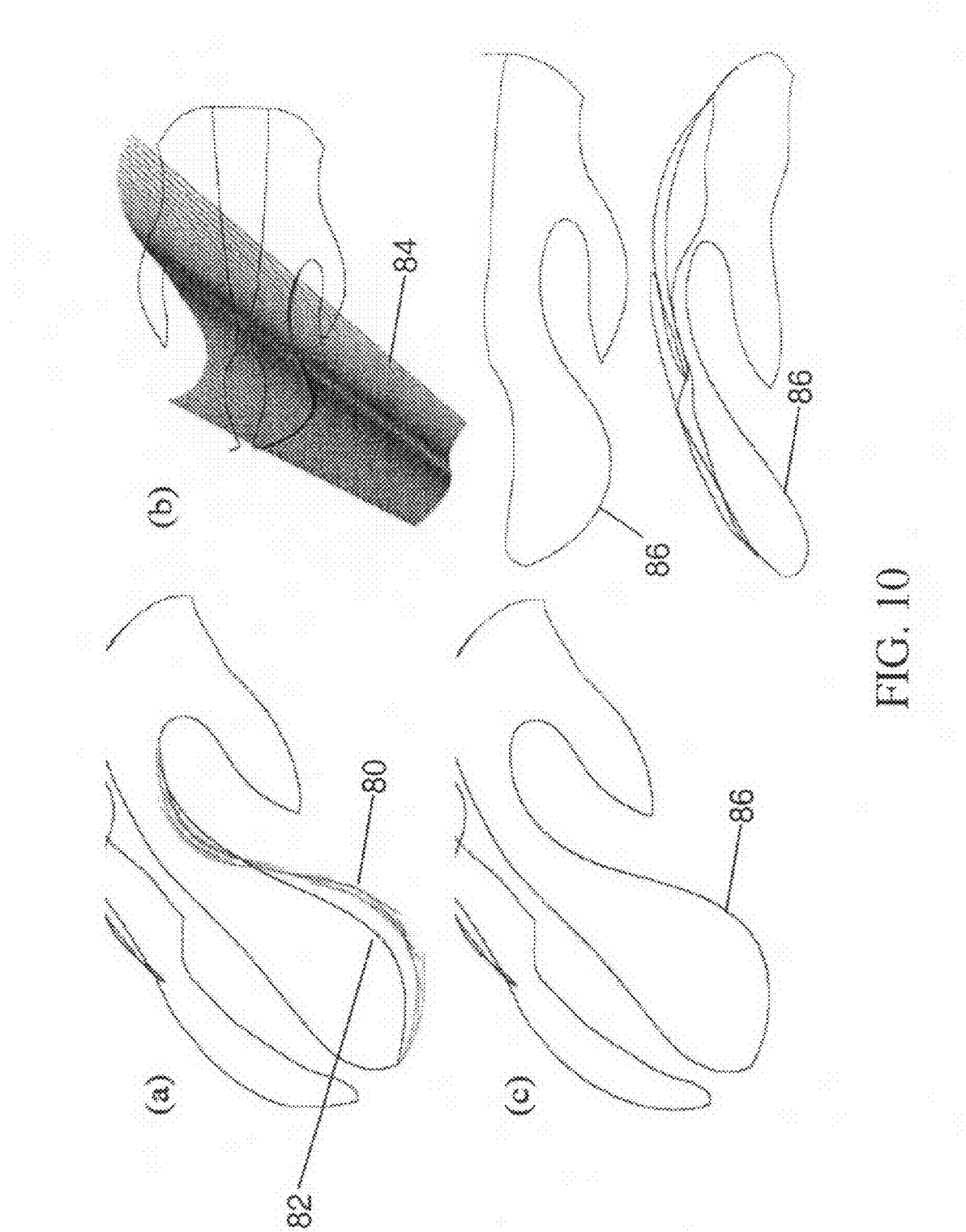
FIG. 10 illustrates curve modification from a single view according to one embodiment of the present invention.

FIG. 10 illustrates curve modification from a single view. FIG. 10(a) illustrates a user's strokes 80 and the corresponding target curve 82. FIG. 10(b) illustrates surface S 84 created by the rays emanating from the user's eyes and passing through the strokes, and the minimum-distance lines from the original curve. FIG. 10(c) illustrates resulting modification 86 from three different views.

Based on these premises, we choose the optimal configuration as the one that minimizes the spatial deviation from the original target curve 82. That is, among the 3D curves whose projections match the newly designed 2D curve 80, we choose the one that lies nearest to the original target curve 82. This can be formulated as follows: let C be a curve in ℝ constrained on a surface S.[3] Let $C^{orig}$ be the original target curve in ℝ that the user is modifying. The new 3D configuration C* of the modified curve is computed as:

$$C^* = \operatorname*{argmin}_C \sum_i \|C_i - C_i^{orig}\|$$

where $C_{i'}$ denotes the i'th vertex of C. With this criterion, C* is found by computing the minimum-distance projection points of $C_i^{orig}$ onto S (FIG. 10b).

The rationale behind this choice is that, by remaining proximate to the original curve 82, the new curve 86 can be thought to be "least surprising" when viewed from a different viewpoint. One advantage of this is that curves can be modified incrementally, with predictable outcomes in each step. That is, as the curve desirably conforms to the user's strokes in the current view, it still preserves most of its shape established in earlier steps as it deviates minimally from its previous configuration. This allows geometrically complex curves to be obtained by only a few successive modifications from different viewpoints.

6.2 Two-View Modification

Figure 11:
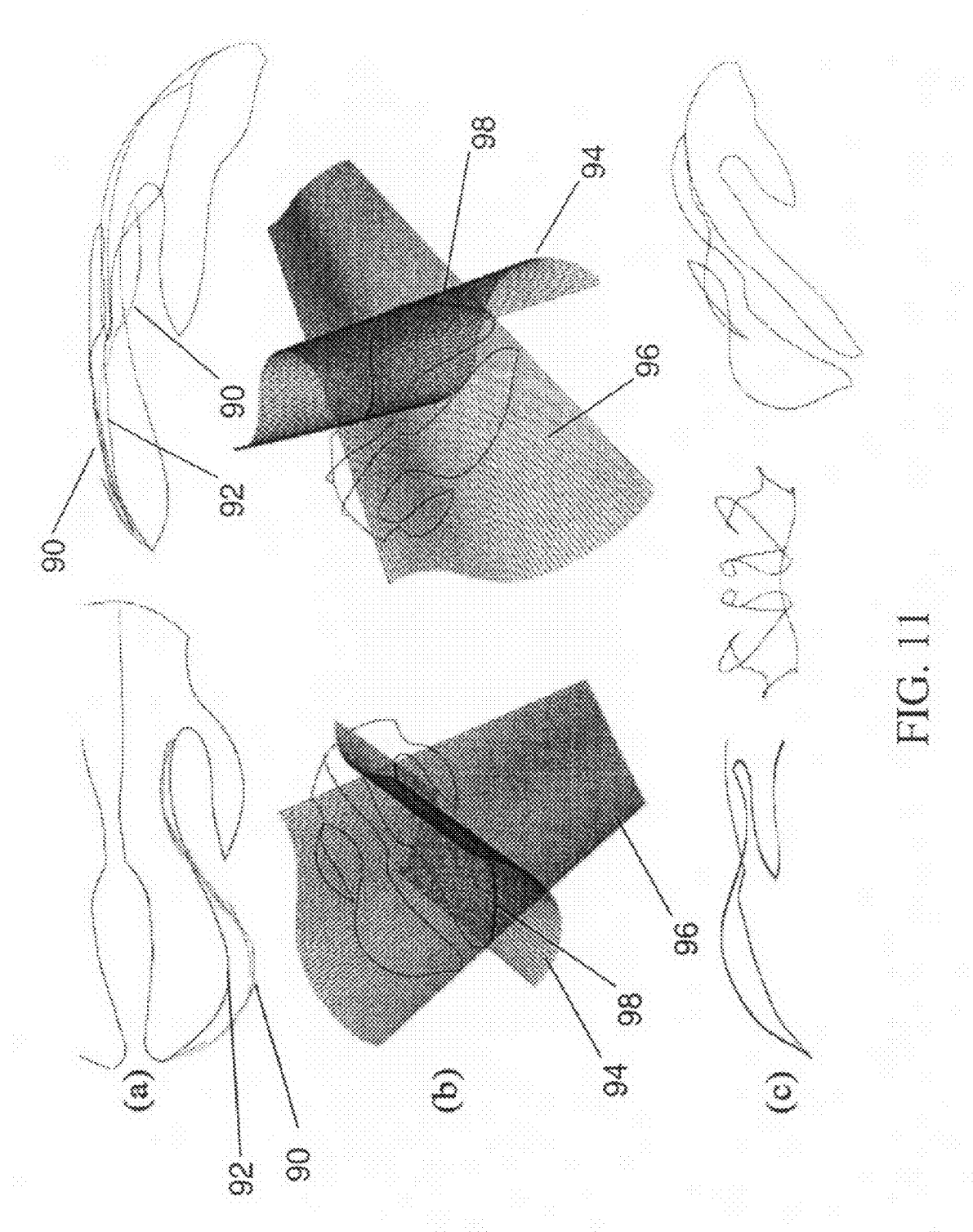
FIG. 11 illustrates curve modification from two views according to one embodiment of the present invention.
Figure 12:
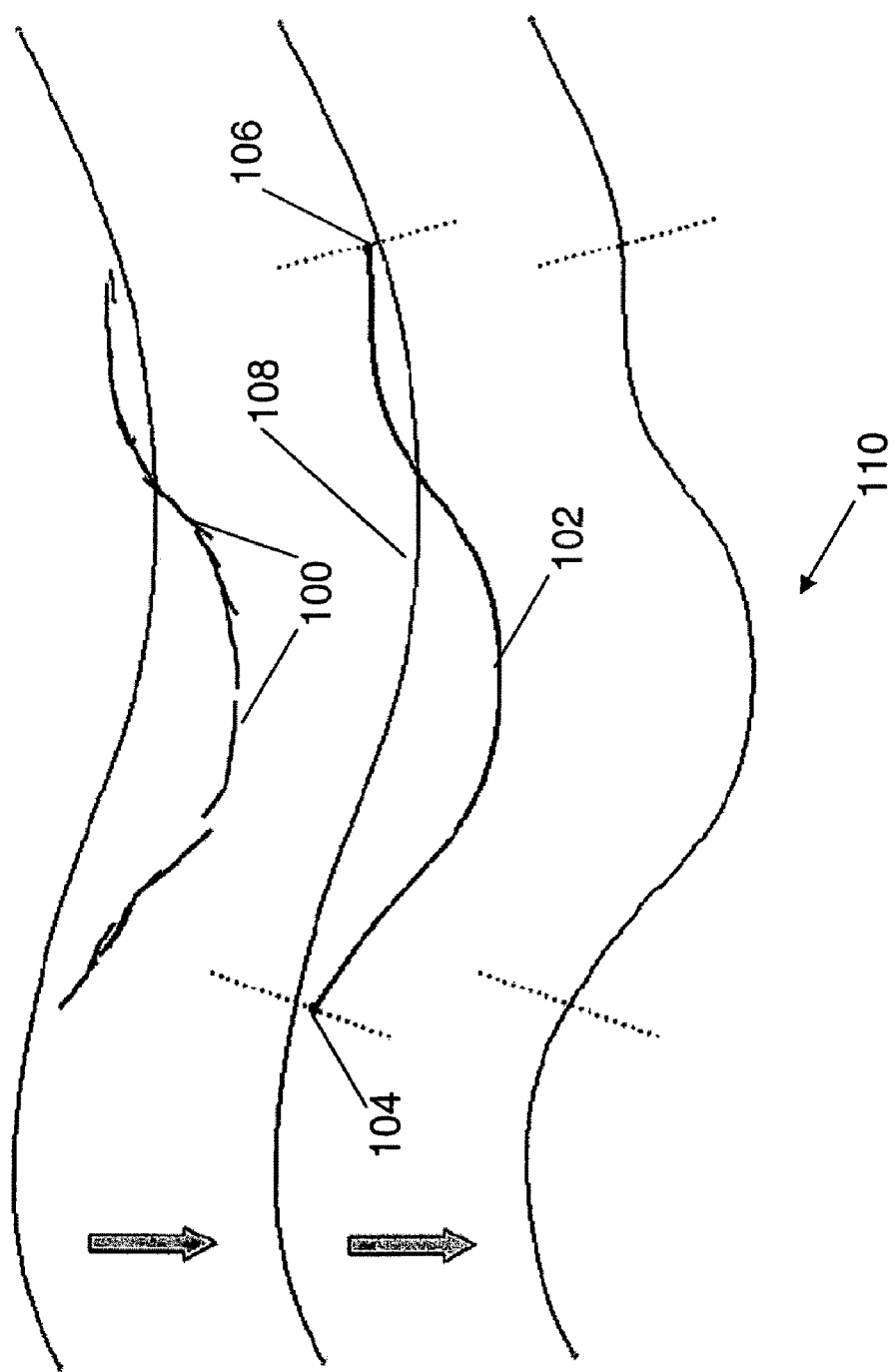
FIG. 12 illustrates local curve modification according to one embodiment of the present invention.

FIG. 11 illustrates curve modification from two views. In FIG. 11(a) the user-draws the desired shape 90 of the target curve 92 from two distinct views. In FIG. 11(b) the user's input defines two surfaces 94, 96 that extend into 3D. The intersection curve 98 of these two surfaces 94, 96 dictates the new shape of the curve. FIG. 11(c) illustrates the resulting modification from different views.

As mentioned, successive applications of the above single-view modification can be used to modify a curve into any desired shape. The two-view modification method provides yet a faster alternative to the single-view modification, especially when the curve in question cannot be easily depicted from a single view. In this setting, the user sketches the new shape of the curve from two arbitrary (but distinct) views. Similar to the single-view method, the modifiers drawn in each view define a surface that emanates from the current viewpoint, and extends into 3D passing through the modifiers. As shown in FIG. 11, the key here is that the intersection of these two surfaces 94, 96 define a unique curve 98 in 3D. This curve 98 is the theoretical common solution of the curves 90 drawn in the two views.

We compute the intersection curve between the two surfaces in the form of a polyline, i.e., a set of points connected by line segments. The points comprising the polyline are the intersections between the longitudinal triangles obtained by triangulating the rays emanating form the eye.

With this newly obtained 3D curve in hand, the original curve is once again modified using a snake-based energy minimization method. The difference, however, is that the snake algorithm is now applied directly in 3D, rather than in 2D. In this case, a 3D snake is instantiated from the original curve. The snake then conforms to the curve defined by the intersection of two surfaces.

Note that although the intersection curve can be readily taken as the new modified curve, we still choose to create the modified shape through energy minimization. This is because the weights in our energy minimization algorithm can be conveniently adjusted to balance curve smoothness versus compliance. This flexibility helps suppress undesirable artifacts such as sharp bends and kinks that occasionally occur when computing the surface intersection curve.

We have found that the two-view modification method is most effective when the two viewing directions are nearly orthogonal to each other. This is because the two views in this case provide mutually exclusive information about the desired shape of the curve, thus maximizing the utility of the technique. When the two viewing directions are the same or nearly parallel, the information obtained from one of the views becomes redundant. A more critical issue, however, is that similar viewing directions may lead to situations that are difficult resolve. This happens especially when the user sketches markedly different curves from two similar viewpoints. In such cases, the two surfaces created through the modifiers may not intersect at all, or produce unexpected intersection curves. It is thus conducive to avoid similar viewing directions when using this method.

7 A Sketch-Based Method for Locally Modifying 3D Curves

This aspect of the invention allows curve modification to be concentrated to an arbitrary local section of a curve. From the user's input strokes, the method automatically deduces which section of the curve is to be modified, together with the new shape of the local section. The method blends the unmodified parts of the curve with the modified section using a smoothing scheme based on Savitzky-Golay filters (see Section 8). All 3D inferences from 2D input are conducted using the inventions presented under Section 6.

In addition to the above method that modifies a curve in its entirety, a curve can also be modified locally. Our solution to local curve modification is based on the constraint stroke-based oversketching described in [FLEISCH, T., RECHEL, F., SANTOS, P., AND STORK, A. 2004. Constraint stroke-based oversketching for 3d curves. In *EUROGRAPHICS Workshop on Sketch-Based Interfaces and Modeling.*]. FIG.

12 illustrates the idea on a 2D example. Here, the set of modifier strokes 100 is first converted into a smooth B-spline 102 using the same techniques employed during curve creation. Next, the two extremal points 104, 106 of this modifier curve are determined. These points 104, 106 are then used to identify a finite section of the target curve 108 that will be modified. For this, the two points 104, 106 on the target curve 108 that are spatially most proximate to the two extremal points of the modifying B-spline points are identified. The section along the target curve 108 that falls between these two points 104, 106 is then simply replaced by the modifying curve, to produce the modified curve 110. Often times, the junctions between the original target curve 108 and the newly introduced section will exhibit sharp kinks. To alleviate such artifacts, a smoothing filter is automatically applied to appropriately blend the junctions. This smoothing filter is described in the next section.

The same principles are applied in 3D by first performing all modifications on the 2D projection of the target curve, and then projecting the resulting 2D curve back into 3D using the same techniques used in global curve modification.

8 A Method for Fairing Curves Based on Savitzky-Golay Filters

This aspect of the invention allows users to create fair 2D/3D curves. This method improves the local geometric characteristics of a curve such that its curvature profile exhibits a smooth distribution, while preserving the overall shape of the curve.

After creation and modification, a final refinement can be optionally applied to a curve to improve its geometric quality. This refinement, based on Savitzky-Golay filters [PRESS, W. H., TEUKOLSKY, S. A., VETTERLING, W. T., AND FLANNERY, B. P. 1992. *Numerical Recipes in C: The Art of Scientific Computing*. Cambridge University Press, New York, N.Y., USA.], works to improve the local geometric characteristics of the curve such that its curvature profile exhibits a more regular distribution. As described in [SAPIDIS, N. S. 1994. *Designing Fair Curves and Surfaces: Shape Quality in Geometric Modeling and Computer-Aided Design.*] this plays a critical role in improving the aesthetic appeal of the curve.

TABLE 1

|  | $v_{-3}$ | $v_{-2}$ | $v_{-1}$ | $v$ | $v_{+1}$ | $v_{+2}$ | $v_{+3}$ |
|---|---|---|---|---|---|---|---|
| Order = 2 | −0.095 | 0.143 | 0.286 | 0.333 | 0.286 | 0.143 | −0.095 |
| Order = 2 |  | 0.000 | 0.257 | 0.371 | 0.342 | 0.171 | −0.143 |
| Order = 2 |  |  | 0.257 | 0.371 | 0.342 | 0.171 | −0.143 |
| Order = 2 |  |  |  | 0.950 | 0.050 | −0.150 | 0.050 |
| Order = 4 | 0.022 | −0.130 | 0.325 | 0.567 | 0.325 | −0.130 | 0.022 |

The Savitzky-Golay filter can be thought to be a sliding window containing a smoothing polynomial that adjusts a vertex position through a weighted averaging scheme applied around its neighborhood. It simulates a least-squares fitting in the sliding window that moves the vertex on to the smoothing polynomial. This filter is commonly used in signal smoothing and denoising [PRESS, W. H., TEUKOLSKY, S. A., VETTERLING, W. T., AND FLANNERY, B. P. 1992. *Numerical Recipes in C: The Art of Scientific Computing*. Cambridge University Press, New York, N.Y., USA.]. A key advantage of this filter over other averaging schemes is that it is known to gracefully eliminate noise from a signal without causing unwarranted flattening at its salient peaks.

In this work, we adopt this idea to 3D curve fairing. To the best of our knowledge, Savitzky-Golay filters have not been used in 3D curve fairing to date. At the heart of our technique is an algorithm that determines a set of weights for the vertex in question and its neighbors. These weights are computed based on (1) The number of leftward neighbors, (2) The number of rightward neighbors, and (3) The order of the smoothing polynomial used in the filter. The details of this computation are generally available in the technical literature. Table 1 shows various weights obtained for different choices. In particular, Table 1 illustrates the Savitzky-Golay filter weights for different combinations of leftward and rightward neighbors, and smoothing polynomial order. The middle column corresponds to the target vertex. In all cases, the number of rightward neighbors is 3 while the number of leftward neighbors decreases from 3 to 0 across the first four rows.

Figure 24:
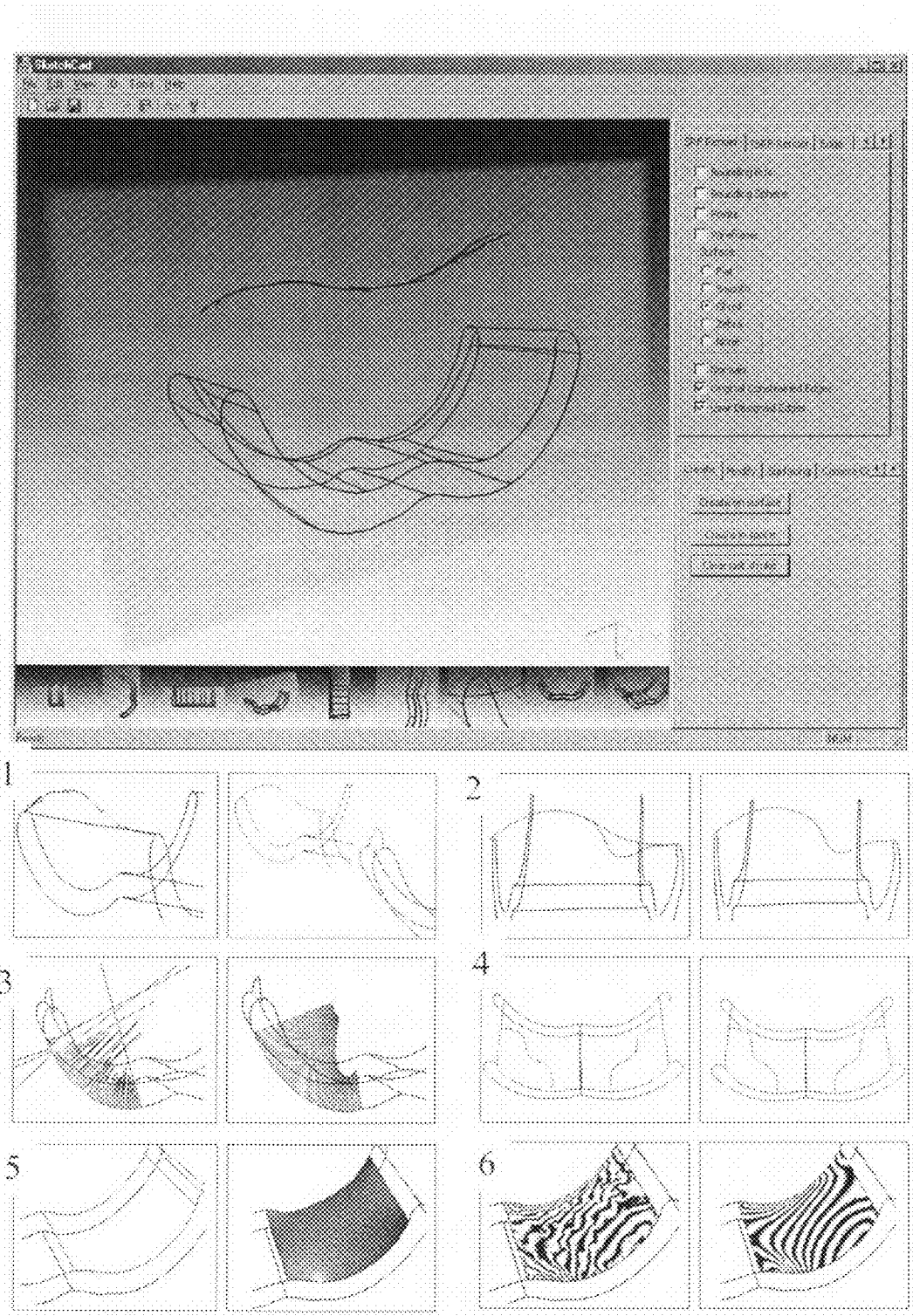
FIG. 24 illustrates one embodiment of a user interface and examples of modeling operations according to one embodiment of the present invention.

In our implementation, we use 3 leftward neighbors, 3 rightward neighbors and a 2nd order polynomial for filtering (Table 1, row 1) for the interior nodes. As mentioned previously, our curves are sampled at 51 data points. We have determined the window size of 3+3+1=7 data points and the order of the filtering polynomial empirically to give the best compromise between local smoothness versus global shape preservation. For the first and last three vertices along a curve, we progressively bias the number of leftward and rightward neighbors based on the number of available neighboring vertices in the vicinity. Once the weights for a given vertex and its neighbors are determined, the new position of the vertex is determined trivially by a weighted sum across its neighborhood:

$$v \leftarrow \sum_{i=-3}^{+3} w_i \cdot v_i$$

where v represents the 3D vertex coordinates and w is the corresponding Savitzky-Golay weight. The above scheme is applied to each of the vertices along the curve to smooth its entirety. In practice, this filter can be applied a multitude of times until the desired results are obtained. FIG. 24-3 shows an example of this smoothing.

9 A Method for Joining the Ends of 3D Curves to Obtain Closed Wireframes

This aspect of the invention allows individually designed 3D curves to be joined to one another, producing closed wireframes. To join two curves, the user first marks the base curve which remains stationary, and the snap curve which undergoes an affine transformation to meet the base curve. Curves can be joined to form either 'T' joints or 'L' joints.

Figure 13:
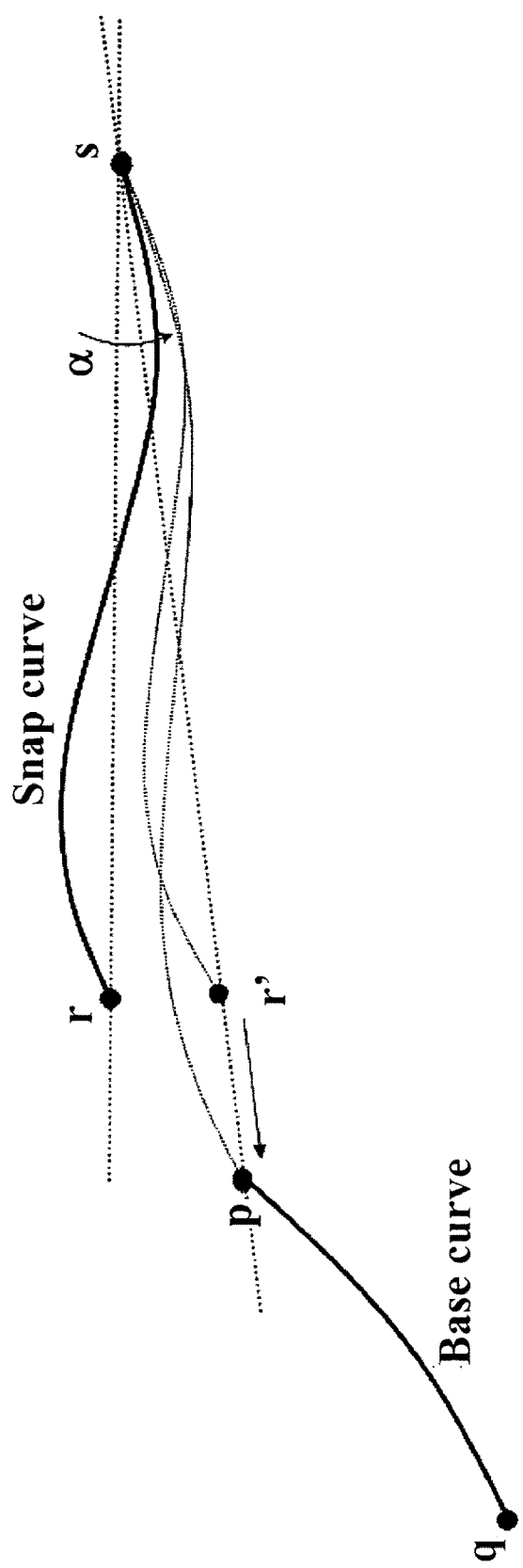
FIG. 13 illustrates curve snapping according to one embodiment of the present invention.

This step allows individually designed curves to be joined to one another, producing closed wireframes. To join two curves, the user first marks the base curve which remains stationary, and the snap curve which undergoes an affine transformation to meet the base curve. FIG. 13 illustrates the idea on the construction of an 'L' joint. In the first step, the points comprising the joint are automatically identified based on spatial proximity (points p and r). Next, the snap curve is first rotated by a about its fixed end not involved in the joint (point s) and then scaled by |p−s|/|r'−s| along its new orientation until the joint is formed. Note that this transformation preserves the intrinsic characteristics of the snap curve, except for a minute alteration introduced by scaling. Nevertheless, this difference is often times not discernable especially if the snapped curves are already spatially proximate. A similar approach is taken to form 'T' joints, except point p now typically lies in the interior of the base curve rather than presiding at one of the two ends.

10 A Sketch-Based Method for Specifying Normal Vectors Along the Edges of 3D Wireframe Models This aspect of the invention allows an intuitive and rapid specification of normal vectors along the edges of 3D wireframe models. Users specify normal vectors by selecting desired vertices and drawing the tangent planes across the selected vertices. The normals of remaining vertices are smoothly interpolated between the specified vertex normals.

Figure 14:
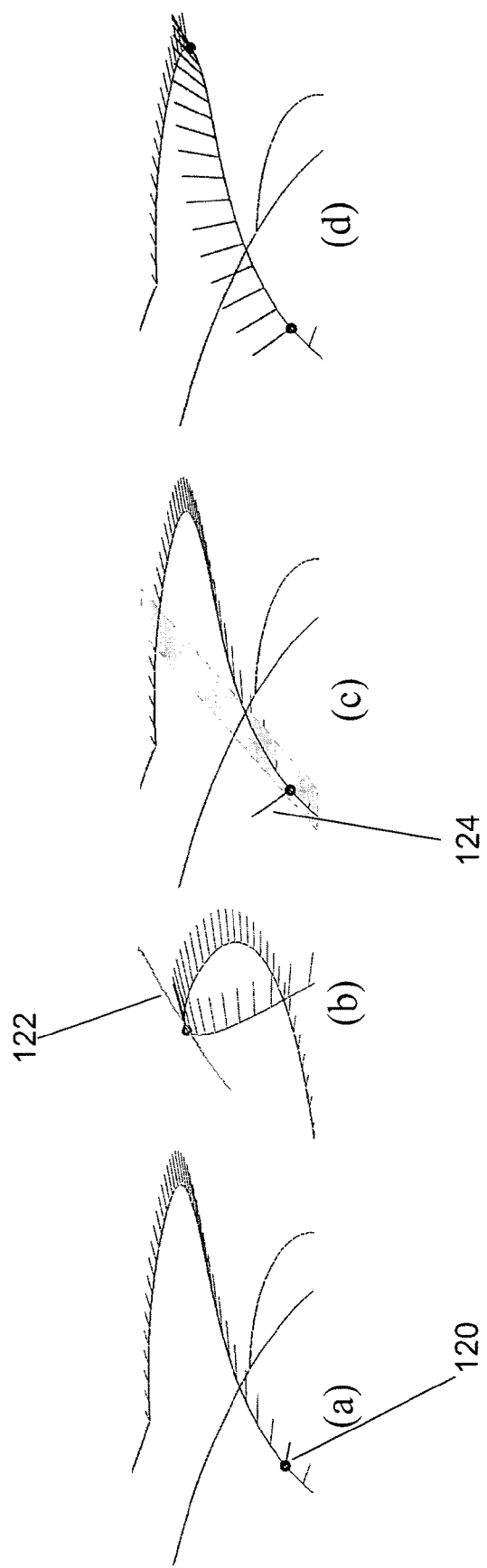
FIG. 14 illustrates specifying boundary normals according to one embodiment of the present invention.

If desired, the user can also specify the boundary conditions along surface edges. Normally, it is assumed that the user wishes the surface boundaries to interpolate the wireframe edges, and hence position constraints are already implicit in the wireframe model. Since created surfaces automatically interpolate the boundary curves, position constraints are readily satisfied. The user, however, can specify tangent directions along various parts of the boundary by sketching the silhouettes of the tangent planes at desired points. FIG. 14 shows an example. For this, the user first marks a boundary vertex 120, across which the tangent will be specified (FIG. 14a). Next, after transforming to a suitable viewpoint, the user sketches the tangent plane 122 as it would be seen from the side (FIG. 14b). This defines a plane in 3D that passes through the input strokes, and extends into the page along the current viewpoint. The normal vector 124 of this virtual plane is then set as the normal of the vertex under consideration (FIG. 14c). Note that the normal of a vertex provides precisely the same information as the tangent plane through the vertex.

We only require the user to specify the normal directions (in the form of tangent planes) at a handful of discrete vertices. The normal directions at intermediate vertices along the boundary are identified using a weighted linear averaging function. For instance, the normal vector at an intermediate vertex q is computed as the weighted average of two surrounding vertices p and r as:

$$n_q = (w)n_p + (1-w)n_r$$

where w is distance (along the boundary) between vertices q and r divided by the distance (along the boundary) between vertices p and r. With this formulation, normals at intermediate vertices will change smoothly between the normals of p and q. FIG. 14d shows an example. If necessary, more control on the normal directions can be achieved by increasing the number of vertices for which the normals are explicitly specified. Once specified, these constraints are taken into account by both the surface creation and deformation tools described above, resulting in surfaces that conform to the constraints. Note that specification of the boundary normals naturally results in our surfaces to be $G^1$ continuous across the boundary edges.

11 A Sketch-Based Method for Smooth Surface Modification Using Physically Based Pressure Forces This aspect of the invention allows the user to modify a surface through direct sketching of the new shape of the surface. To deform a surface, the user first draws a skeletal curve on the original surface. Next, as a way to describe the desired modification, the user sketches the contemplated shape of the skeletal curve (called a target curve). Using the 3D curve deformation technique mentioned under Section 6, the method first computes the 3D configuration of the target curve. Next, the method deforms the surface in its entirety until the original skeletal curve matches well with the target curve.

The surface is deformed using a virtual pressure force that is applied to the surface. The simulated pressure force inflates and deflates the surface smoothly. The extent of modification is controlled by the magnitude of the simulated pressure.

This aspect of the invention uses a readily available optimization algorithm to find the optimum value of the pressure force to deform the surface. The method minimizes the Haussdorff distance between the original skeletal curve (which is being deformed together with the surface) and the target curve.

Figure 15:
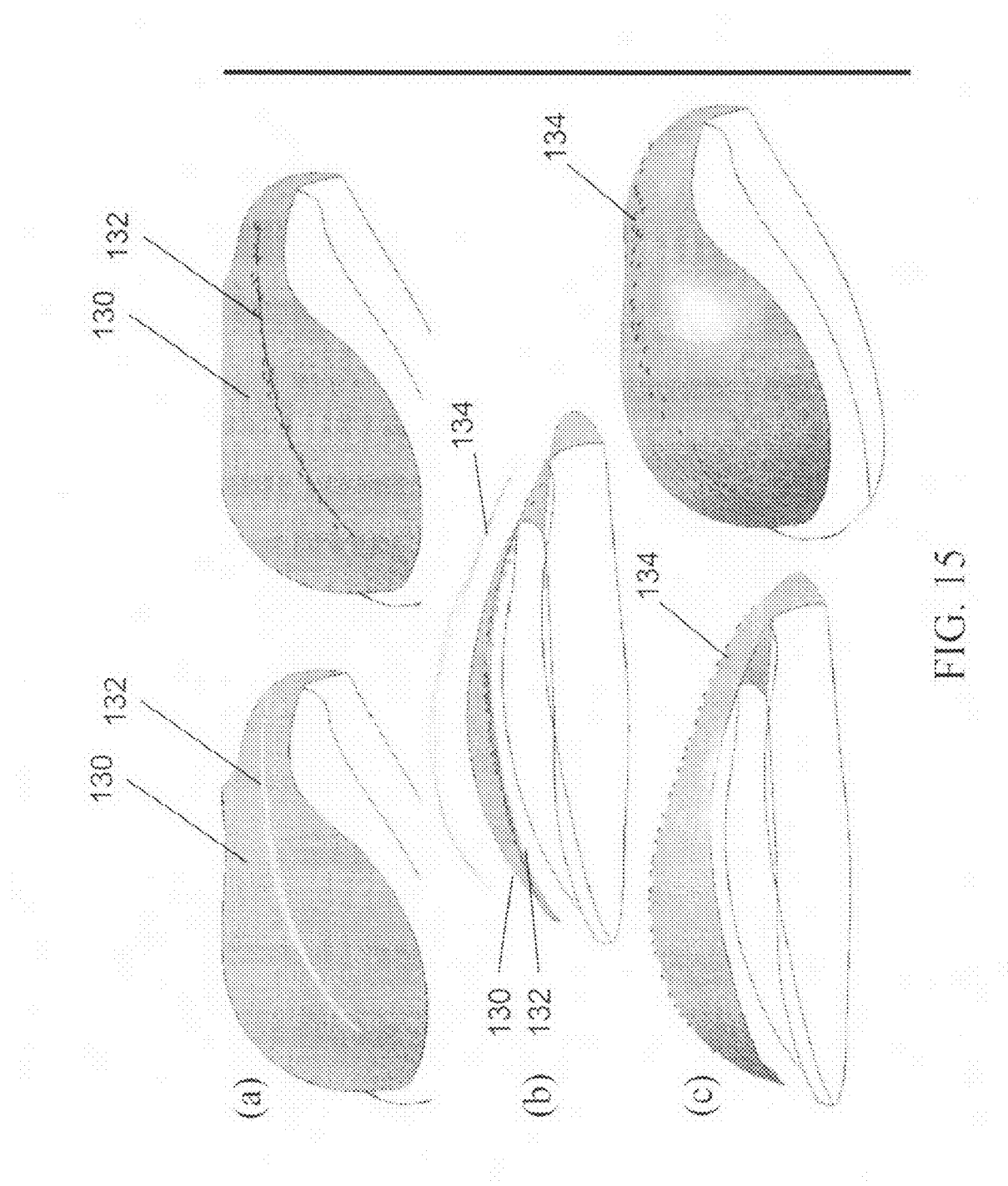
FIG. 15 illustrates surface deformation according to one embodiment of the present invention.

This process will now be described with reference to FIG. 15. In particular, initially created surfaces can be modified to give them the desired shape according to the present invention. To deform a surface 130, the user first sketches a reference curve 132 on it as shown in FIG. 15a. This curve 132 defines a region of interest in which the surface vertices closest to the reference curve 132 are selected for subsequent deformation. Next, the user sketches a new curve 134 that specifies the desired shape of the reference curve 132 in 3D (FIG. 15b). The 3D configuration of this new curve 134 is computed by modifying the reference curve 132 using the methods described earlier. Given the initially selected surface vertices and the new curve 134, the present invention invokes an optimization algorithm that deforms the surface until the selected surface vertices lie close to the target shape (FIG. 15c). During deformation, the objective function we minimize is the Hausdorff distance [RUCKLIDGE, W. J. 1996. *Efficient Visual Recognition Using the Hausdorff Distance.* Number 1173 Lecture Notes in computer Science, Springer-Verlag, Berlin.] between the surface vertices, and the points comprising the target curve 134. The Hausdorff distance provides a convenient metric that reveals the spatial proximity between two point sets in the form of an upper bound: If the Hausdorff distance is d, all points in the first point set are at most distance d away from the other point set (and vice versa).

At the heart of our deformation mechanism is an intuitive method that simulates the effect of a pressure force on a thin membrane (see KARA, L. B., D'ERAMO, C., AND SHIMADA, K. 2006. Pen-based styling design of 3d geometry using concept sketches and template models. In *ACM Solid and Physical Modeling Conference.* for more details). This tool allows surfaces to be inflated or flattened in a predictable way. A key advantage of this technique is that surfaces can be deformed wholistically in a smooth way without generating unintended creases. The extent of the deformation depends on the magnitude of the pressure, whose optimal value is determined by our optimization algorithm. In other words, our algorithm seeks for the optimal pressure value which produces a deformation that minimizes the Hausdorff distance mentioned above. FIG. 15c shows the result of a surface deformed using this technique.

11.1 Surface Modification Using Pressure Force

This deformation tool simulates the effect of a pressure force on a thin membrane. The tool allows surfaces to be inflated or flattened in a predictable way. The extent of the deformation depends on the magnitude of the pressure, which is controlled by the user through a slider bar. Different pressure values can be specified for individual surfaces, thus giving the user a better control on the final shape of the solid model.

Figure 16:
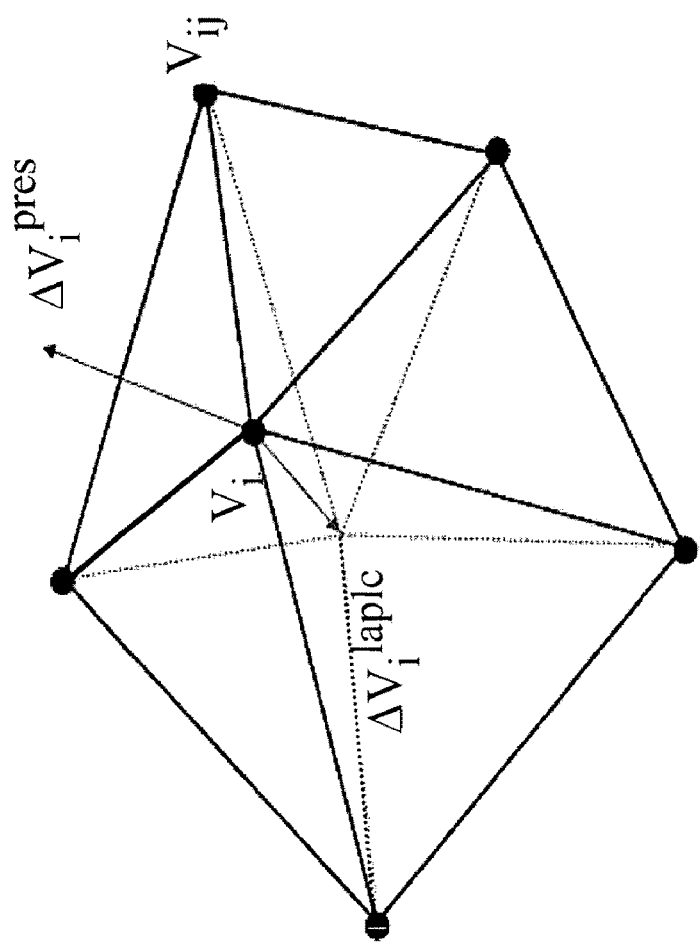
FIG. 16 illustrates how the equilibrium position of a pressurized surface is found according to one embodiment of the present invention.

The equilibrium position of a pressurized surface is found iteratively. In each step, each vertex of the surface is moved by a small amount proportional to the pressure force applied to that vertex. The neighboring vertices, however, resist this displacement by pulling the vertex toward their barycenter akin to Laplacian smoothing. The equilibrium position is reached when the positive displacement for each node is balanced by the restitutive displacement caused by the neighboring vertices. FIG. 16 illustrates the idea.

The algorithm can be outlined as follows. Let p be the pressure applied to the surface. Until convergence do:

--- for each vertex $v_i$
  Compute the unit normal $n_i$ at vertex $v_i$
  Computer the pressure force on $v_i$
    $F_i = p \cdot A_i^{voronoi}$
    $\Delta v_i^{pres} = F_i \cdot n_i$ $$\Delta v_i^{laplc} = \left(\frac{1}{K}\sum_{j=1}^{K} v_{ij}\right) - v_i,$$

where $v_{ij}$ is one of the K adjacent vertices of $v_i$ $v_i \leftarrow v_i + ((1 - \xi)\Delta v_i^{pres} + \gamma \Delta v_i^{laplc})$
end for

---

Figure 17:
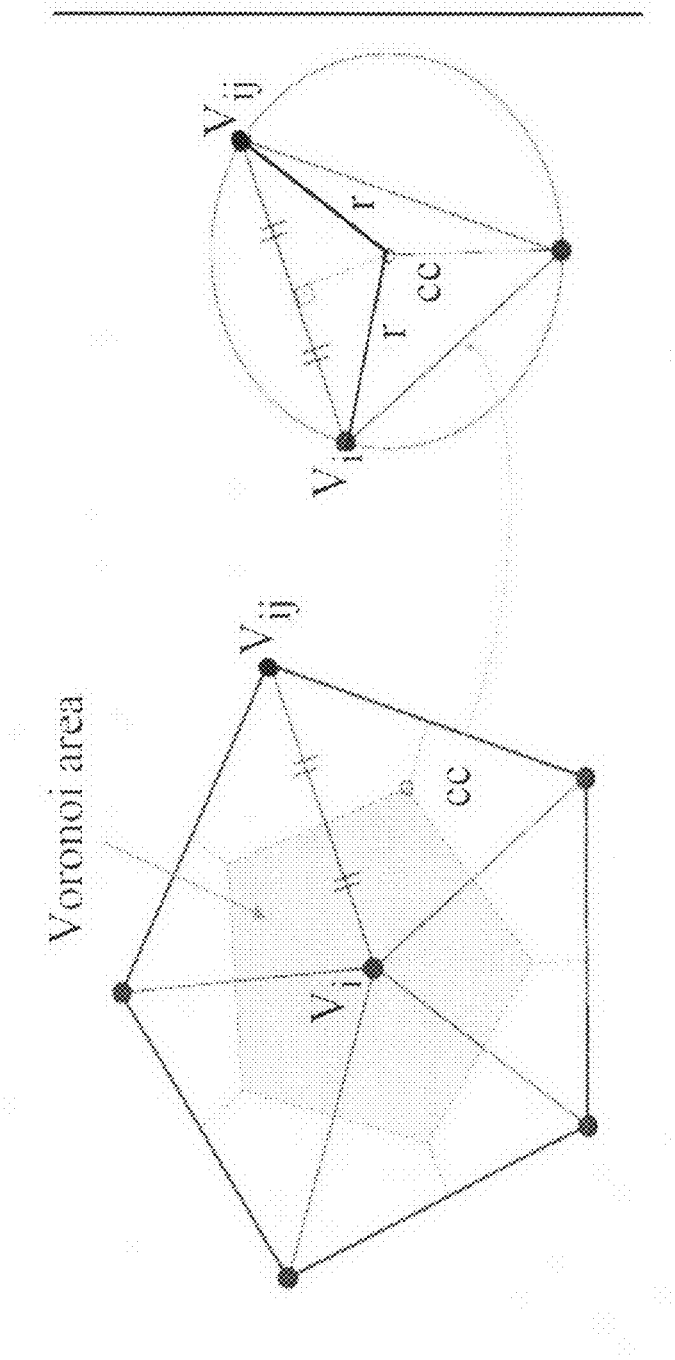
FIG. 17 illustrates Voronoi area surrounding vertex $v_i$.

The vertex normal $n_i$ is updated in each iteration and is computed as the average of the normals of the faces incident on $v_i$, weighted by the area of each face. $A_i^{voronoi}$ is the Voronoi area surrounding $v_i$. It is obtained by connecting the circumcenters of the faces incident on $v_i$ with the midpoints of the edges incident on $v_i$ (FIG. 17). $\xi$ and $\gamma$ are damping coefficients that control the convergence rate. Too low values of $\xi$ or $\gamma$ may cause instability in convergence.

Figure 18:
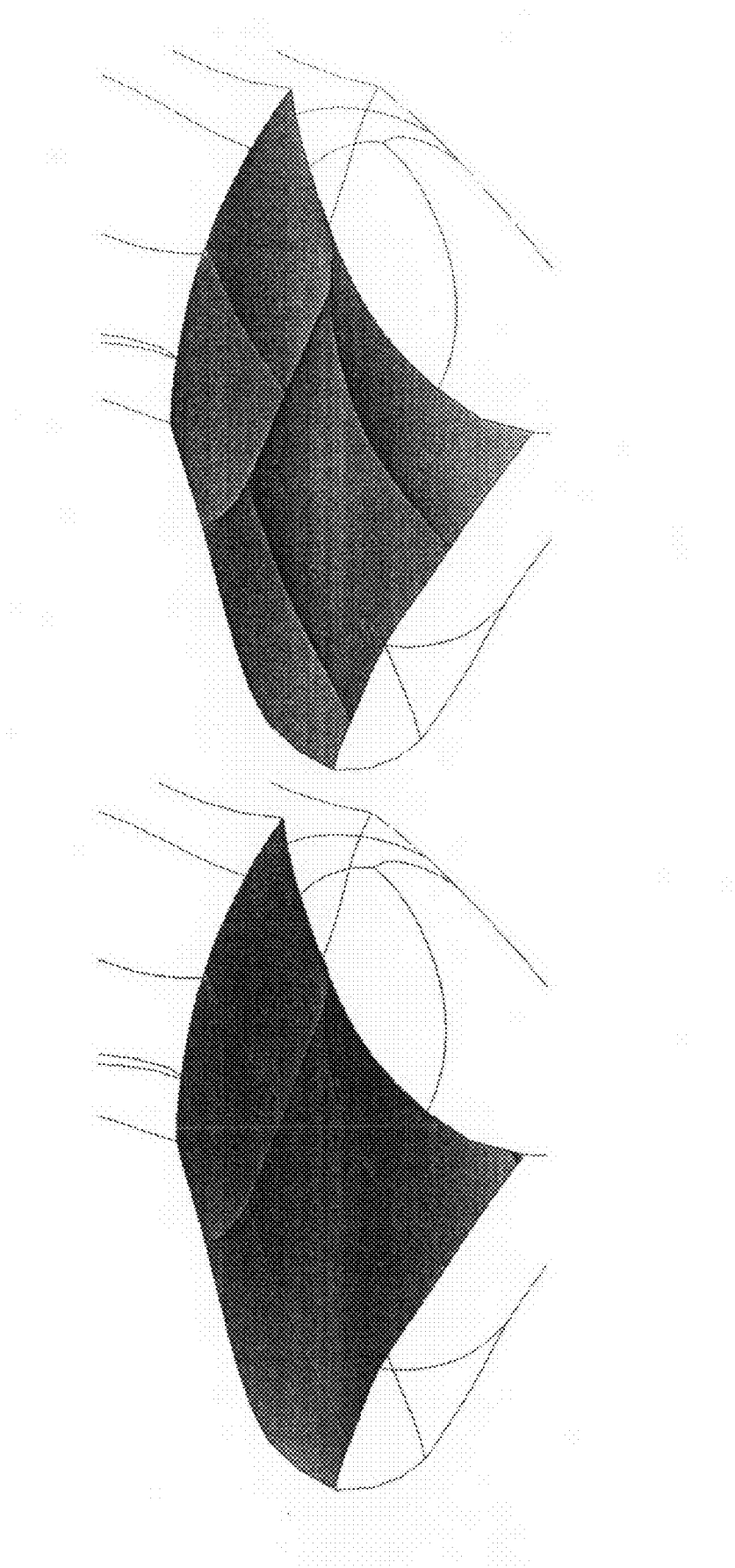
FIG. 18 illustrates the modification of a seat base using pressure force.

The above algorithm is applied to all surface vertices while keeping the boundary vertices fixed. FIG. 18 shows an example on the seat model. If necessary, negative pressure can be applied to form concavities.

12 A Trainable and Extensible Single-Stroke Gesture Recognizer for Invoking Commands on a Sketch-Based Interface This aspect of the invention allows users to invoke commands on a sketch-based interface. The method recognizes a certain set of single-stroke pen gestures and executes a command associated with the gesture. Besides the main modeling operations described so far, the present invention also provides a gesture-based command interface for inputting frequently used commands. The command interface is extensible and customizable in that new gestures can be trained, or existing gestures can be linked to different commands.

The recognizer is trainable with a single example of each gesture. That is, users can train the recognizer by providing a single example of each of the gestures to be used.

The recognizer is based on a feature vector comparison method. During training, the pen stroke defining each gesture is first scaled to fit into a zero-centered square while preserving its aspect ratio and orientation. The recognizer then uses the coordinates of the transformed stroke as a feature vector that defines the gesture. The same process is applied to all training gestures. During recognition, the feature vector extracted from the unknown gesture is evaluated against each of the trained gestures. The gesture with the best match is returned as the recognition result.

Figure 19:
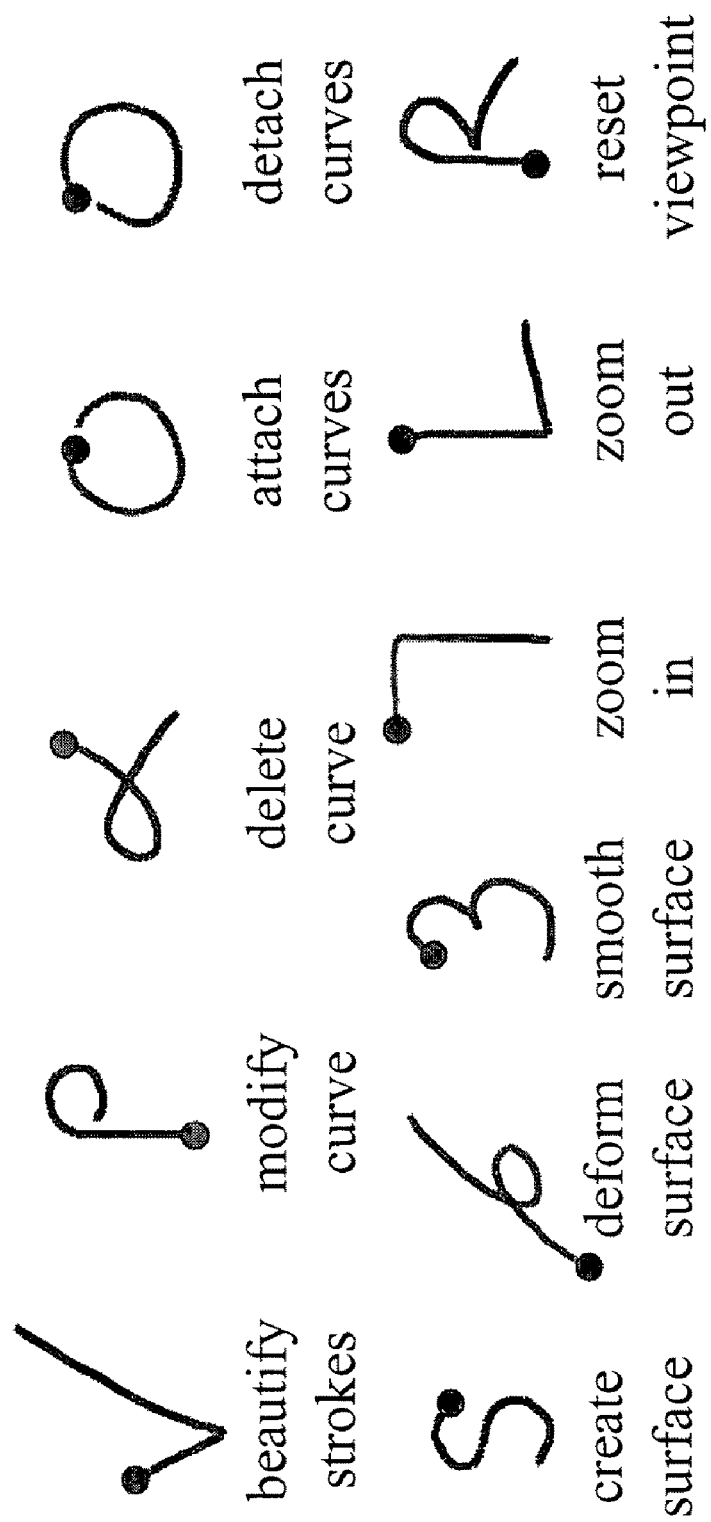
FIG. 19 illustrates the gestures and their associated commands that can be used according to one embodiment of the present invention.

FIG. 19 shows the currently used gestures and their associated commands. Each gesture is a single stroke entity that is sensitive to orientation and drawing direction. Due to variation in drawing speeds, input raw strokes frequently consist of data points spaced non-uniformly along the stroke's trajectory (low pen speeds cause dense point clouds while high pen speeds cause large gaps between points), which adversely affect their recognition. To alleviate this difficulty, input strokes are first resampled using a linear interpolation function to obtain data points equally spaced along the stroke's trajectory.

Figure 20:
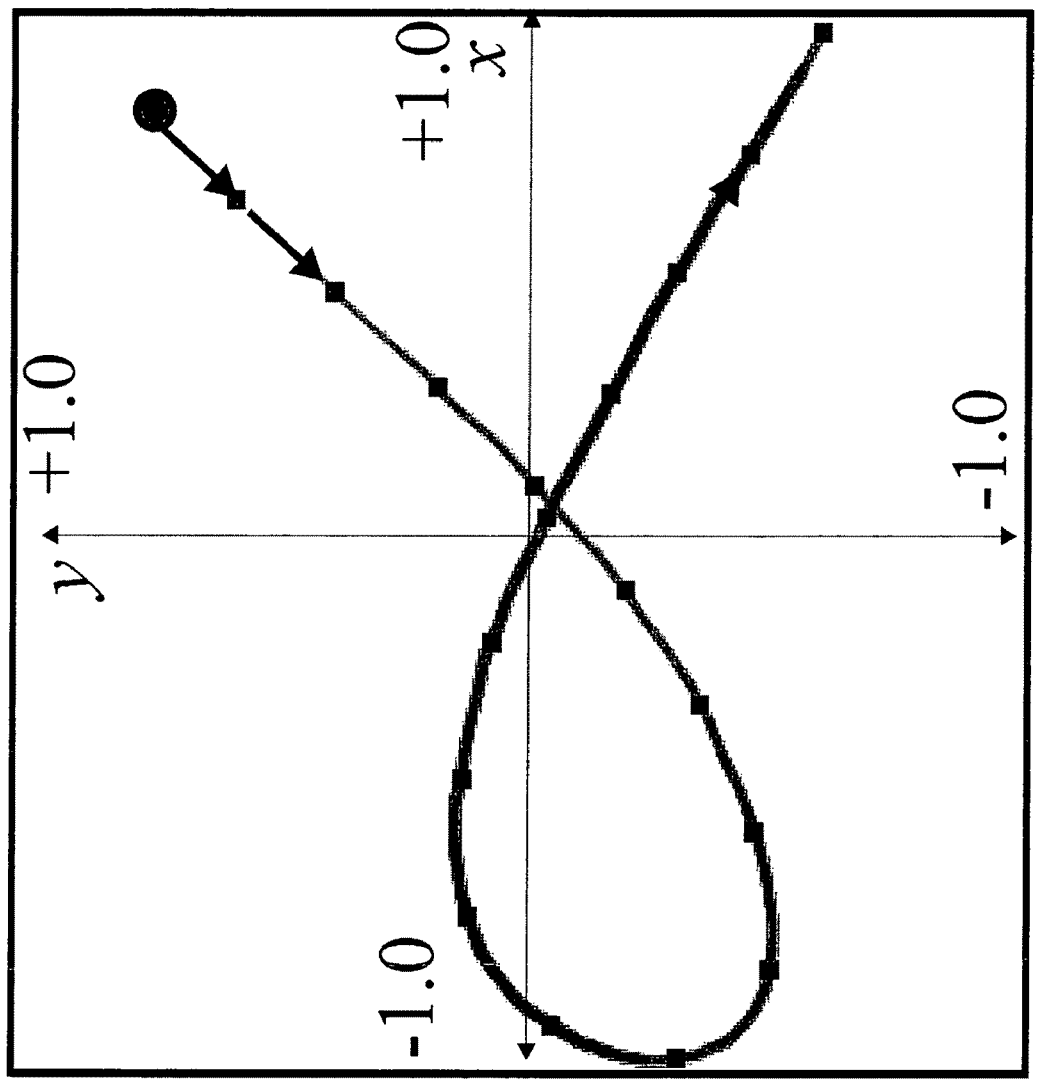
FIG. 20 illustrates the input gesture is transformed to fit into a square while preserving its aspect ratio and orientation. The ordered set of transformed coordinates along the gesture is used as the feature vector.

The recognition is based on a feature vector comparison method. During training, the pen stroke defining each gesture is first scaled to fit into a zero-centered square while preserving its aspect ratio and orientation (FIG. 20). This framing desirably makes recognition insensitive to scale differences while preserving the overall shape and orientation of the gesture. The recognizer then uses the coordinates of the transformed stroke as a feature vector that defines the gesture. The same process is applied to all training gestures. Resulting feature vectors are stored in a database of gestures. During recognition, the feature vector extracted from the unknown gesture in the same way is evaluated against each of the definition gestures. This involves computing the summed total distance between pairs of (ordered) coordinates from the definition and unknown gestures. The gesture with the best match is returned as the recognition result. With this matching criterion, two identical gestures will yield a total distance of '0' units. Since coordinates are ordered based on the drawing direction, two geometrically similar gestures would result in a mismatch if drawn in opposite directions. This property is key to distinguish between say a clockwise and a counterclockwise 'O' gesture.

13 Other Examples of the Present Invention

Many modifications and variations are possible with the present invention. For example, the present invention has been described in the context of specific embodiments, although the present invention may be used in other embodiments and is not limited to the specific embodiments described herein. The following describes several additional examples and embodiments of the features of the present invention. These examples and embodiments are not exhaustive, and yet other variations and modifications are still possible with the present invention.

Figure 21:
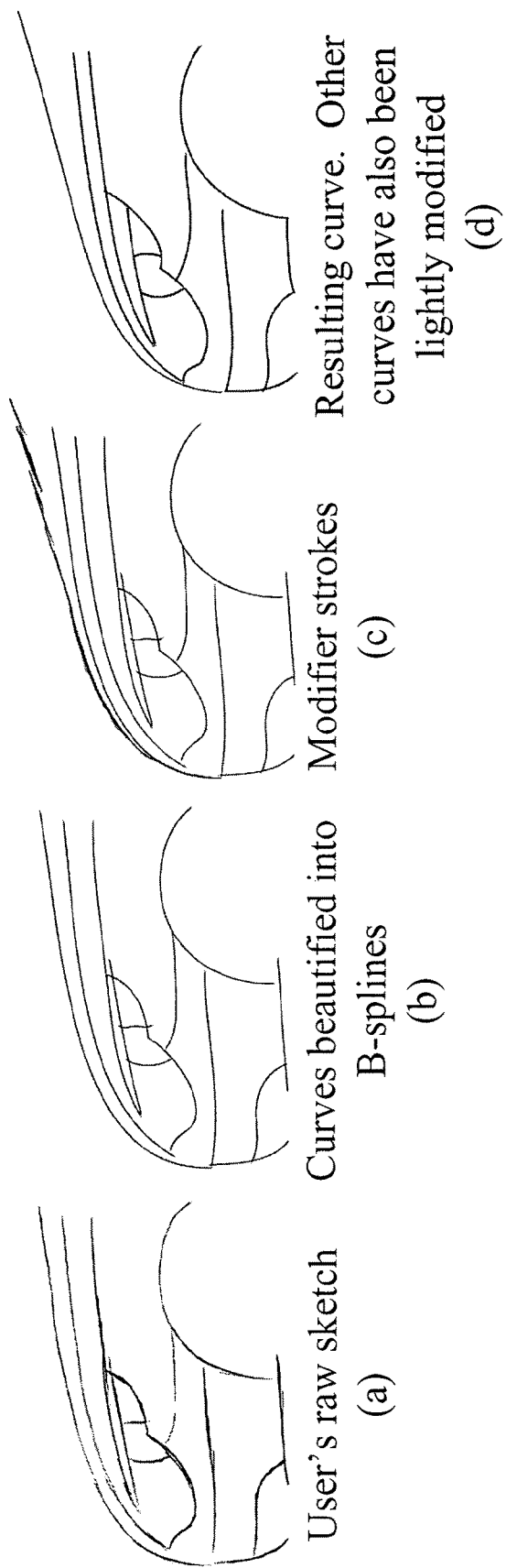
FIG. 21 illustrates curve creation and modification in 2D according to the present invention.

FIG. 21 illustrates curve creation and modification in 2D according to the present invention. Curves are initially created by beautifying input strokes into B-splines. Once created, a curve can be modified by simply sketching its new shape near the original curve.

Figure 22:
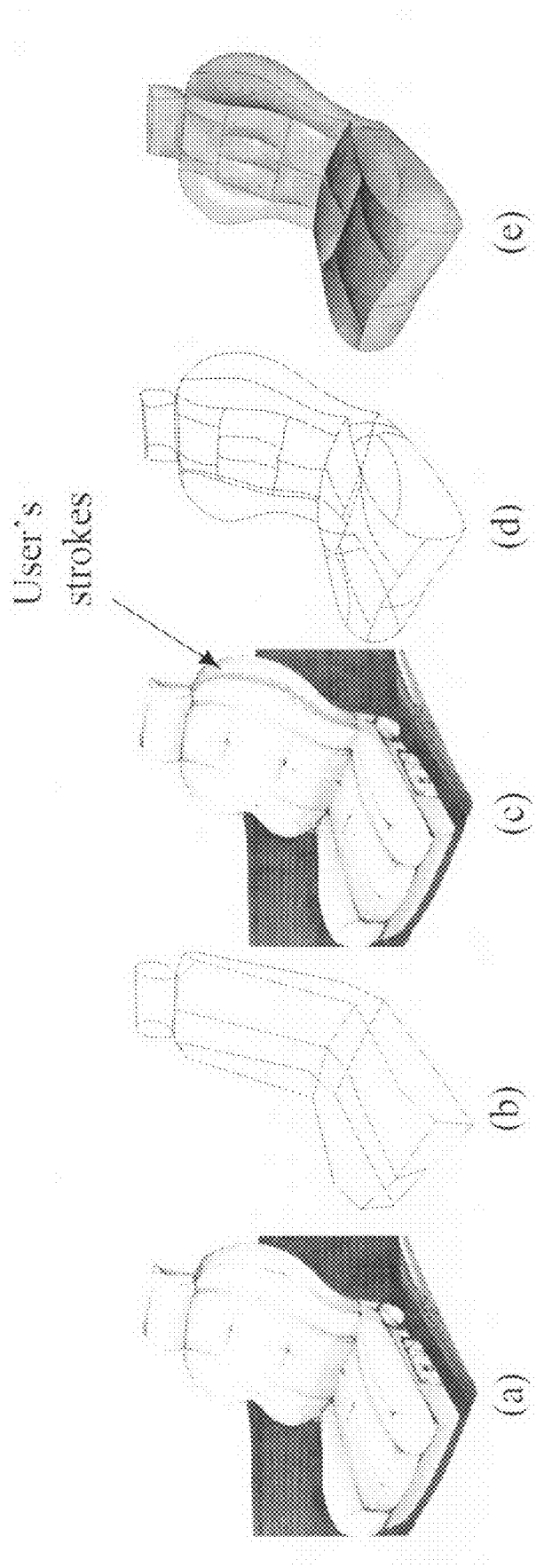
FIG. 22 illustrates an overview of the modeling process according to one embodiment of the present invention.

FIG. 22 illustrates an overview of the modeling process according to one embodiment of the present invention. The input to the system consists of the user's 2D concept sketch (FIG. 22(a)), and a 3D electronic template model (FIG. 22(b)). After aligning the template with the sketch, the user draws directly on the sketch as illustrated in FIG. 22(c). The user's input strokes from FIG. 22(c) modify the underlying electronic template. FIG. 22(d) illustrates the final shape obtained after modifying the template and adding new feature edges. (e) The final solid model after surface creation and modification. The final surfaces are designed using a pressure-based deformation tool.

Figure 23:
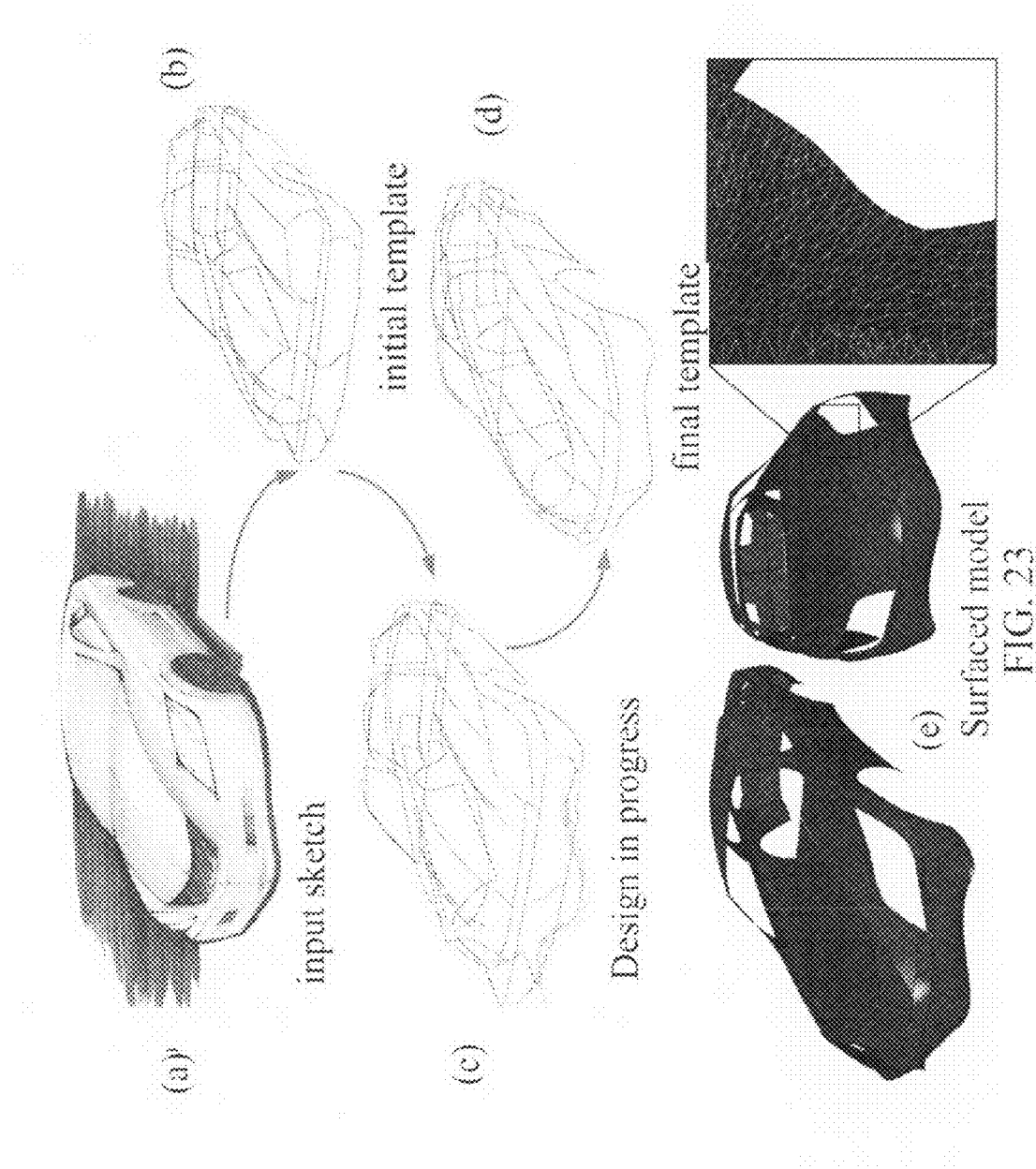
FIG. 23 illustrates the design of a car according to one embodiment of the present invention.

FIG. 23 illustrates the design of a car using the present invention. FIG. 23(a) illustrates an input sketch. FIG. 23(b) illustrates an initial electronic template model to be used for this design. FIG. 23(c) illustrates an intermediate stage of the electronic three-dimensional model as it is being transformed from the initial template to the final design. FIG. 23(d) illustrates the electronic three-dimensional wireframe model that results from this process. FIG. 23(e) illustrates a three-dimensional surfaced model. Surfaces are refined using pressure force and V-spring. Also shown is a close up of the triangular mesh near the headlight. Notice the strong feature edge near the front grill, which is also apparent in the original sketch.

FIG. 24 illustrates one embodiment of a user interface and examples modeling operations according to the present invention. The template in this example is the rectangular prism rendered in semi-transparent ghost view. FIG. 24(1) illustrates a global 3D curve modification and results from different views. FIG. 24(2) illustrates local 3D curve modification. FIG. 24(3) illustrates curve fairing. FIG. 24(4) illustrates curve snapping. The wavy curve is the snap curve, and the other curve is the base curve. The wavy curve has been snapped to the side and the front of the sofa both as 'T' joints. FIG. 24(5) illustrates surface creation and modification with pressure force. FIG. 24(6) illustrates surface fairing. Surface noise on the left has been added artificially to emphasize the effect.

Figure 25:
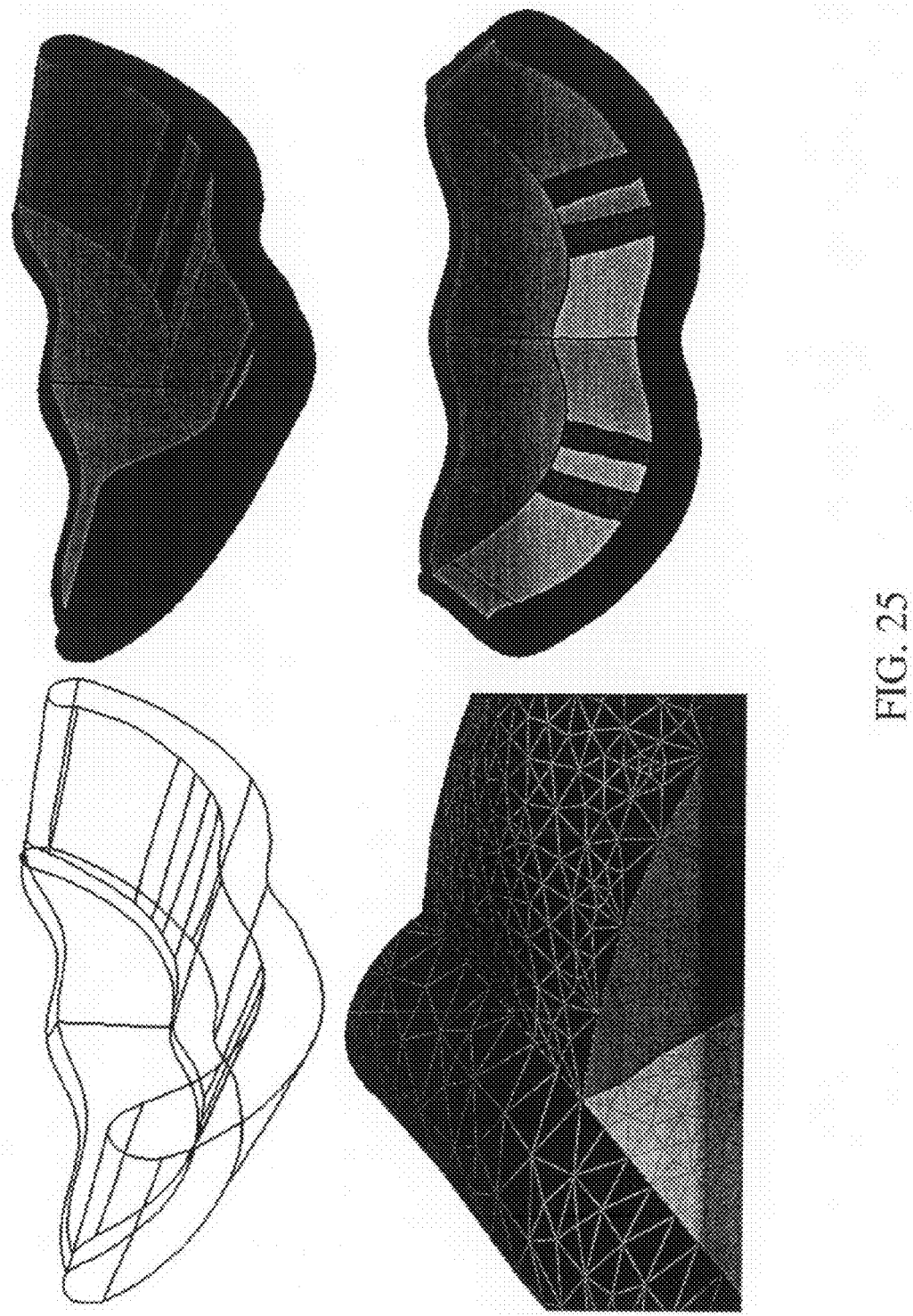
FIG. 25 illustrates the final wireframe and the painted surface model of a sofa according to one embodiment of the present invention.

FIG. 25 illustrates the final wireframe and the painted surface model of a sofa. The closeup view reveals the surface triangulation.

Figure 26:
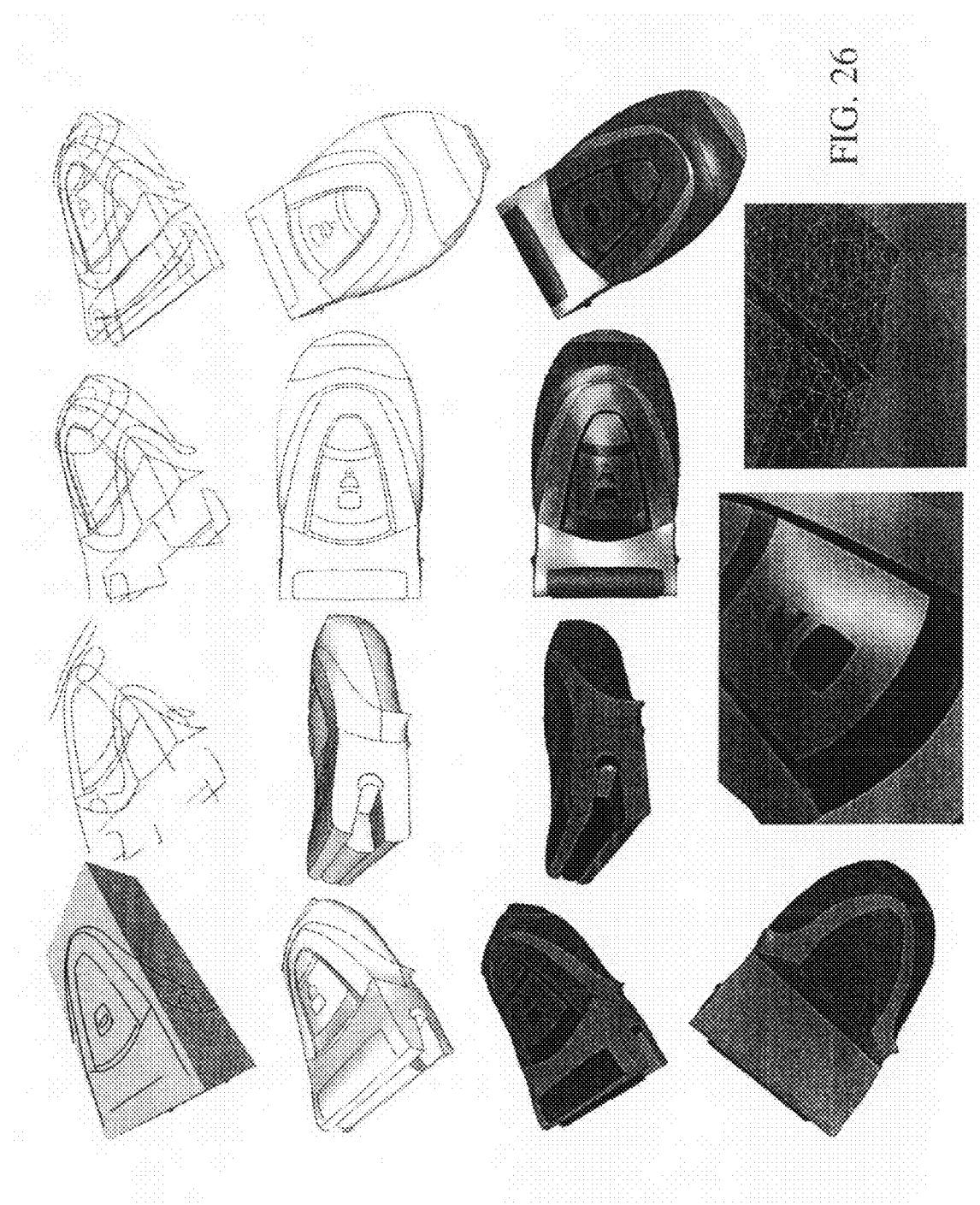
FIG. 26 illustrates the design of an electric shaver according to one embodiment of the present invention.

FIG. 26 illustrates the design of an electric shaver. FIG. 26(a) illustrates the wireframe creation. FIG. 26(b) illustrates the surfaced model rendered in white. FIG. 26(c) illustrates the surfaced model painted. FIG. 26(d) illustrates the bottom and top faces, and a detail view of the polygonal surfaces.

FIG. 27 illustrates curve creation and modification in 3D according to the present invention. FIG. 27(a) illustrates an initial 3D template helps anchor input strokes in 3D. FIG. 27(b) illustrates a curve can modified by simply sketching its new shape. The optimal 3D configuration is determined by minimizing the deviation from the original curve in 3D, while closely approximating input strokes in 2D. FIG. 27(c) illustrates a final wireframe model.

Although the present invention has generally been described in terms of specific examples, the present invention is applicable to many methods, apparatuses, and systems. Those and other variations and modifications of the present invention are possible and contemplated, and it is intended that the foregoing specification and the following claims cover such modifications and variations.

The invention claimed is:

1. A computer drawing system, comprising:
   a two dimensional input device;
   a display device;
   a processor connected to the input device and the display device, wherein the processor includes memory containing computer readable instructions which, when executed, cause the processor to:
      define a three dimensional shape model;
      receive from the two dimensional input devices an input indicative of a two dimensional hand drawn element to be incorporated into the three dimensional shape model;
      map the two dimensional hand drawn element to a corresponding existing portion of the three dimensional shape model; and
      modify the corresponding existing portion of the three dimensional shape model to resemble the two dimensional hand drawn element.

2. The system of claim 1, wherein the computer readable instructions, when executed, cause the processor to display a two dimensional image on the display device prior to receiving the input from the two dimensional input device.

3. The system of claim 1, wherein the computer readable instructions, when executed, cause the processor to display the three dimensional shape model on the display devices prior to receiving the input from the two dimensional input device.

4. The system of claim 3, wherein after the processor modifies the corresponding portion of the three dimensional shape model, the computer readable instructions, when executed, cause the processors to display the three dimensional shape model with the corresponding portion of the three dimensional shape model modified to resemble the two dimensional hand drawn element.

5. The system of claim 1, wherein the three dimensional shape model is selected from a group consisting of a three dimensional wire frame shape model, a three dimensional surface shape model, and both a three dimensional wire frame shape model and a three dimensional surface shape model.

6. The system of claim 5, wherein:
   the three dimensional shape model is a three dimensional wire frame shape model; and
   the processor modifies the three dimensional wire frame shape model in response to the two dimensional hand drawn element.

7. The system of claim 6, wherein:
   the three dimensional shape model also includes a three dimensional surface shape model; and
   the processor modifies the three dimensional surface shape model in response to modifications to the three dimensional wire frame shape model.

8. The system of claim 1, wherein:
   the three dimensional shape model includes both a three dimensional wire frame shape model and a three dimensional surface shape model; and
   the processor modifies the three dimensional surface shape model.

9. The system of claim 8, wherein changing the three dimensional shape model includes the computer readable instructions, when executed, cause the processor to:
   modify the three dimensional surface shape model; and
   not modify the three dimensional wire frame shape model when the three dimensional surface shape model is modified.

10. The system of claim 1, wherein the computer readable instructions, when executed, cause the processor to:
    display a two dimensional image on the display device prior to receiving the input from the two dimensional input device; and
    align the two dimensional image with the three dimensional shape model.

11. The system of claim 10, wherein aligning the two dimensional image with the three dimensional shape model includes:
    identifying at least three points on the two dimensional image; and
    identifying at least three corresponding points on the three dimensional shape model.

12. The system of claim 1, wherein:
    the input indicative of a two dimensional hand drawn element includes a plurality of two dimensional hand drawn elements collectively forming the two dimensional hand drawn element; and
    the processor defines each of the plurality of two dimensional hand drawn elements with a plurality of data points;
    the processor identifies a direction of maximum spread of the data points defining the plurality of two dimensional hand drawn elements;
    the processor defines a straight line approximation of the data points;

the processor projects the data points onto the straight line approximation of the data points;

the processor sorts the data points based on their position on the straight line approximation; and the processor forms a single two dimensional element based on the sorted data points.

13. The system of claim 12, wherein the plurality of two dimensional hand drawn elements are drawn in at least two different directions.

14. The system of claim 12, wherein before the processor forms a single two dimensional element based on the sorted data points, data points representing each of the plurality of two dimensional hand drawn elements are equally spaced along each of the plurality of two dimensional hand drawn elements.

15. The system of claim 1, wherein an input indicative of a two dimensional hand drawn element includes pressure applied to the input device and speed of the hand drawn element.

16. The system of claim 12, wherein after the processor forms a single two dimensional element, the processor transforms the single two dimensional element into a three dimensional element.

17. The system of claim 16, wherein the processors transforms the single two dimensional element into a three dimensional element by projecting the single two dimensional element onto the three dimensional shape model using a ray-tracing algorithm.

18. The system of claim 16, wherein:

the single two dimensional element has end points on the three dimensional shape model and a body portion that is not on the three dimensional shape model; and the processor transforms the body portion of the two dimensional element into a three dimensional body portion using a physically-based three-dimensional curve algorithm.

19. The system of claim 18, wherein the processors transforms the body portion of the two dimensional element into a three dimensional body portion using a physically-based three-dimensional curve algorithm based on an energy minimization algorithm utilizing active contours.

20. The system of claim 1, wherein the processors modifies the corresponding portion of the three dimensional shape model by:

projecting the corresponding portion of the three dimensional shape model onto a two dimensional plane corresponding to the two dimensional hand drawn element;

changing the portion of the three dimensional shape model that is projected onto the two dimensional plane to resemble the two dimensional hand drawn element, producing a modified two dimensional portion of the three dimensional shape model; and projecting the modified two dimensional portion of the three dimensional shape model back into the three dimensional shape model, producing a modified portion of the three dimensional shape model.

21. The system of claim 20, wherein projecting the modified two dimensional portion of the three dimensional shape model back into the three dimensional shape model includes minimizing special deviation between the corresponding portion of the three dimensional shape model and the modified portion of the three dimensional shape model.

22. The system of claim 1, wherein the input indicative of a two dimensional hand drawn element is from a single vantage point.

23. The system of claim 1, wherein:

the processor receives from the two dimensional input device an input indicative of a plurality of two dimensional hand drawn elements, wherein each two dimensional hand drawn element is from a different vantage point of the three dimensional shape model; and the processor modifies the corresponding portion of the three dimensional shape model by:

combining the plurality of two dimensional hand drawn elements to form a combined three dimensional hand drawn element; and modifying the corresponding portion of the three dimensional shape model to resemble the combined three dimensional hand drawn element.

24. The system of claim 23, wherein combining the plurality of two dimensional hand drawn elements includes calculating an intersection curve between the plurality of two dimensional hand drawn elements to form a plurality of points connected by line segments.

25. The system of claim 1, wherein:

the three dimensional shape model is comprised of a plurality of elements, and wherein each element is connected to at least one other element; and the corresponding portion of the three dimensional shape model is less than all of an element.

26. The system of claim 1, wherein:

the input indicative of a two dimensional hand drawn element includes:

a hand drawn reference element indicative of the current shape of a corresponding portion of the three dimensional shape model; and a hand drawn element indicative of a desired modified shape of the corresponding portion of the three dimensional shape model;

the processor maps the hand drawn element indicative of a desired modified shape to the corresponding portion of the three dimensional; and the processor modifies the corresponding portion of the three dimensional shape model to resemble the desired modified shape.

* * * * *